(12) United States Patent
Leenders et al.

(10) Patent No.: US 7,923,264 B2
(45) Date of Patent: Apr. 12, 2011

(54) FERROELECTRIC PASSIVE MEMORY CELL, DEVICE AND METHOD OF MANUFACTURE THEREOF

(75) Inventors: Luc Leenders, Herentals (BE); Michel Werts, Antwerp (BE)

(73) Assignee: Agfa-Gevaert N.V., Mortsel (BE)

( * ) Notice: Subject to any disclaimer, the term of this patent is extended or adjusted under 35 U.S.C. 154(b) by 36 days.

(21) Appl. No.: 12/610,775

(22) Filed: Nov. 2, 2009

(65) Prior Publication Data
US 2010/0093110 A1 Apr. 15, 2010

Related U.S. Application Data

(62) Division of application No. 11/313,153, filed on Dec. 20, 2005, now Pat. No. 7,706,165.

(51) Int. Cl.
H01L 21/00 (2006.01)
H01L 51/40 (2006.01)
H01L 21/44 (2006.01)
H01L 21/336 (2006.01)

(52) U.S. Cl. ............ 438/3; 438/99; 438/100; 438/288; 438/393; 257/E21.09; 257/E21.104; 257/E21.663; 257/E21.664

(58) Field of Classification Search ............. 257/E21.09, 257/E21.104, E21.663, E21.664
See application file for complete search history.

(56) References Cited

U.S. PATENT DOCUMENTS

| | | | |
|---|---|---|---|
| 4,169,258 A | 9/1979 | Tannas, Jr. | |
| 5,060,191 A | 10/1991 | Nagasaki et al. | |
| 6,236,587 B1 | 5/2001 | Gudesen et al. | |
| 6,358,437 B1 | 3/2002 | Jonas et al. | |
| 6,611,448 B2 | 8/2003 | Nair et al. | |
| 6,686,211 B1 | 2/2004 | Asakawa | |
| 6,734,478 B2 | 5/2004 | Johansson et al. | |
| 6,804,138 B2 | 10/2004 | Thompson et al. | |
| 6,812,509 B2 | 11/2004 | Xu | |
| 6,878,980 B2 | 4/2005 | Gudesen et al. | |
| 7,595,203 B2 * | 9/2009 | Andideh | 438/3 |
| 2003/0124259 A1 | 7/2003 | Kodas | |
| 2003/0218191 A1 | 11/2003 | Nordal et al. | |
| 2003/0223266 A1* | 12/2003 | Yamamura | 365/145 |

(Continued)

FOREIGN PATENT DOCUMENTS

EP 1054414 A1 11/2000

(Continued)

OTHER PUBLICATIONS de Gans, "Inkjet printing of polymers: State of the art and future developments," Advanced Materials, 16 (3): 203-213 (Feb. 3, 2004).

(Continued)

*Primary Examiner* — Charles Garber
*Assistant Examiner* — Mohsen Ahmadi
(74) *Attorney, Agent, or Firm* — Leydig, Voit & Mayer, Ltd.

(57) ABSTRACT

A first passive ferroelectric memory element comprising a first electrode system and a second electrode system, wherein said first electrode system is at least partly insulated from said second electrode system by an element system comprising at least one ferroelectric element, wherein said first electrode system is a conductive surface, or a conductive layer; wherein said second electrode system is an electrode pattern or a plurality of isolated conductive areas in contact with, for read-out or data-input purposes only, a plurality of conducting pins isolated from one another.

23 Claims, 5 Drawing Sheets

U.S. PATENT DOCUMENTS

| | | |
|---|---|---|
| 2004/0131862 A1 | 7/2004 | Szmanda et al. |
| 2004/0209420 A1 | 10/2004 | Ljungcrantz et al. |

FOREIGN PATENT DOCUMENTS

| | | |
|---|---|---|
| EP | 1415826 A2 | 5/2004 |
| JP | 61-048983 A | 3/1986 |
| WO | WO 99/14762 A1 | 3/1999 |
| WO | WO 99/34371 A1 | 7/1999 |
| WO | WO 00/29208 A1 | 5/2000 |
| WO | WO 02/00759 A1 | 1/2002 |
| WO | WO 02/43071 A1 | 5/2002 |
| WO | WO 02/079316 A2 | 10/2002 |
| WO | WO 02/080627 A2 | 10/2002 |
| WO | WO 03/000765 A2 | 1/2003 |
| WO | WO 03/025953 A1 | 3/2003 |
| WO | WO 03/048228 A1 | 6/2003 |
| WO | WO 03/048229 A1 | 6/2003 |

OTHER PUBLICATIONS

Naber et al., "Low voltage switching of a spin cast ferroelectric polymer," Applied Physics Letters, 85 (11): 2032-2034 (Sep. 13, 2004).

Sawyer et al., "Rochelle salt as a dielectric," Physical Review, 35 (Second Series): 269-273 (Feb. 1, 1930).

Wang et al., "Dewetting of conducting polymer inkjet droplets on patterned surfaces," Nature Materials, 3 (3): 171-176 (Mar. 2004).

* cited by examiner

FERROELECTRIC PASSIVE MEMORY CELL, DEVICE AND METHOD OF MANUFACTURE THEREOF

This patent application is a divisional of copending U.S. patent application Ser. No. 11/313,153, filed Dec. 20, 2005, which is incorporated by reference.

FIELD OF THE INVENTION

The present invention concerns a ferroelectric passive memory cell, device including the cell and the manufacture thereof.

BACKGROUND OF THE INVENTION

Recently, there has been a growing demand for cheap and flexible tags and labels in which information can be stored, for example as anti-counterfeiting tags in packaging or as identification tags. Production of such a memory device should be cheap and it should be easy to incorporate in the package printing process or the packaging process and should consist of uncomplicated and cheap materials and involve a minimum of processing steps. For use in packages, it is important that the memory device is relatively robust and insensitive to mechanical shock, temperature changes and other environmental influences. In numerous applications, it is important that the information stored in the memory device can be electrically written, read, erased and rewritten.

One type of memory cells that has proven to be rewritable and bistable over prolonged periods of time is based on ferroelectric memory materials. Printing of a memory device on a package or label is only possible at relatively low temperatures in view of the packaging materials used. This excludes the use of inorganic ferroelectric materials and silicon-based driving circuitry which both need temperatures in the range of 300° C. to 400° C., which would result in melting or severe degradation of polymer-based or paper-based substrates suitable of use with packaging materials. Furthermore, the use of high temperature stable polymeric substrates, such as polyimide, is excluded, due to the high cost of the substrate material compared to paper or inexpensive polymeric substrates such as polyethylene (PE) or poly(ethylene terephthalate) (PET).

JP 61-048983A discloses a ferroelectric high polymer thin film and describes how a copolymer of vinylidene fluoride and trifluoroethylene is formed and used as a memory material in a passive memory device.

U.S. Pat. No. 5,060,191 discloses a ferroelectric memory comprising: a ferroelectric thin film having first and second surfaces opposite to each other; a first electrode assembly including a plurality of stripe electrodes arranged in parallel on the first surface side of said ferroelectric thin film; a second electrode assembly including a plurality of stripe electrodes arranged in parallel on the second surface side of said ferroelectric thin film, said stripe electrodes of said second electrode assembly crossing over said stripe electrodes of said first electrode assembly; first and second common electrodes arranged separately from end portions of said respective first and second electrode assemblies and extending in respective directions in which said stripe electrodes of said first and second electrode assemblies are arranged; and selection means for respectively connecting said first and second electrode assemblies to said first and second common electrodes and for selectively activating at least one of said stripe electrodes of each of said first and second electrode assemblies. U.S. Pat. No. 5,060,191 further discloses that a proper solvent can be selectively used for polymer organic material according to the chemical structure and composition ratio thereof, and therefore the film can be formed by effecting the coating-drying process in the spin coating method, dip method, printing method or the like. However, fully printed devices are not disclosed.

U.S. Pat. No. 6,812,509 discloses a memory cell comprising: a) an organic semiconductor having two opposed surfaces; b) two spaced apart electrodes in contact with one surface of the organic semiconductor, wherein the distance there between is a channel length and the portion of the organic semiconductor therebetween is defined as a channel region; c) a ferroelectric polymer having a dielectric constant and two opposed surfaces wherein one surface is in contact with one surface of the organic semiconductor for at least a portion of the channel region; and d) a gate electrode in contact with one surface of the ferroelectric polymer for at least a portion of the channel region; and e) an organic dielectric interposed between the ferroelectric polymer and the organic semiconductor. U.S. Pat. No. 6,812,509 further discloses a memory cell comprising: a) a substrate having a surface; b) an organic semiconductor having first and second surfaces wherein the first surface is adjacent to the surface of the substrate; c) two spaced apart electrodes in contact with one surface of the organic semiconductor, wherein the distance there between is a channel length and the portion of the organic semiconductor therebetween is defined as a channel region; d) an organic dielectric having first and second surfaces wherein the first surface is in contact with the second surface of the organic semiconductor; e) a ferroelectric polymer having a dielectric constant and two opposed surfaces wherein one surface is in contact with second surface of the organic dielectric for at least a portion of the channel region; and f) a gate electrode in contact with one surface of the ferroelectric polymer for at least a portion of the channel region. U.S. Pat. No. 6,812,509 also discloses that these organic thin film semiconductors can be made by well known processes such as vacuum evaporation, electrochemical polymerization, solution spin coating, screen printing, ink jet printing, and Langmuir-Blodgett growth. These organic field effect transistors use a ferroelectric thin film polymer as gate dielectric. Such devices have the disadvantage of having relatively complex structures with stringent requirements in respect of layer thickness and electrode spacing.

U.S. Pat. No. 6,686,211 discloses a method for forming a non-volatile memory device, comprising: forming first electrodes separated from one another by barrier members; depositing an organic thin film solution on the first electrodes and solidifying at least a portion of the organic thin film solution to form a thin film, wherein the thin film is capable of a polarization inversion by exposure to an electric field; wherein the barrier members are formed to include a first insulating layer and a second layer that repels the organic thin film solution; and forming a second electrode on the thin film on the first electrodes. U.S. Pat. No. 6,686,211 further discloses a method for manufacturing a semiconductor device having a ferroelectric capacitor that is provided between a lower electrode and an upper electrode, the method for manufacturing a semiconductor device comprising the steps of: providing a semiconductor substrate including a transistor, forming an insulation layer overlying the transistor, forming a lower electrode over the insulation layer, wherein the lower electrode is in electrical contact with a part of the transistor, forming partitioning members over the insulation layer, the partitioning members adapted to separate the lower electrode from other lower electrodes, and depositing a solution for forming an organic layer over the lower electrode that is partitioned from other lower electrodes by the partitioning members, wherein the organic layer is not deposited directly above the partitioning members, and thereafter solidifying the same to form the organic layer. U.S. Pat. No. 6,686,211 also discloses that the organic thin film can be coated and patterned by an ink jet type recording head and that a variety of other printing methods can be used to coat the organic thin film material solution such as spin-coating, spray-coating and the like. However, fully printed devices are not disclosed.

WO 02/043071A1 discloses a ferroelectric memory circuit (C) comprising a ferroelectric memory cell in the form of a ferroelectric polymer thin film (F) and first and second electrodes (E1; E2) respectively, contacting the ferroelectric memory cell (F) at opposite surfaces thereof, whereby a polarization state of the cell can be set, switched or detected by applying appropriate voltages to the electrodes (E1; E2), characterized in that at least one of the electrodes (E1; E2) comprises at least one contact layer (P1; P2), said at least one contact layer (P1; P2) comprising a conducting polymer contacting the memory cell (C), and optionally a second layer (M1; M2) of a metal film contacting the conducting polymer (P1; P2), whereby said at least one of the electrodes (E1; E2) either comprises a conducting polymer contact layer (P1; P2) only, or a combination of a conducting polymer contact layer (P1; P2) and a metal film layer (M1; M2). WO 02/043071A1 further discloses that in thin films, a stiff metal substrate on which the film is normally deposited by spin-coating, may inhibit the crystallization process due to the heterogeneous nucleation process which determines the crystallite orientation being influenced by the substrate and that it is preferable to deposit the conducting polymer thin film by means of spin coating, and similarly depositing the ferroelectric polymer thin film on the first contact layer by means of spin coating. The all-polymer ferroelectric memory devices exemplified are prepared by spincoating and evaporation techniques.

US 2004/0131862A1 discloses a process of forming a ferroelectric polymer film comprising: disposing a solution comprising a ferroelectric polymer film precursor composition and a solvent composition onto a substrate, wherein the solvent composition has a $\Delta_v$ value of greater than or equal to 8.5, wherein $\Delta_v = (\delta_d^2 + \delta_p^2)^{1/2}$, $\delta_d$ being a Hansen dispersive solubility parameter and $\delta_p$ being a Hansen polar solubility parameter; and removing at least a portion of the solvent to produce a ferroelectric polymer film. Furthermore US 2004/0131862A1 specifically claims the ferroelectric copolymer with 50 to 90 mol % of vinylidene fluoride and 10 to 50 mol % of trifluoroethylene and specifically exemplifies the use of PGMEA, propylene glycol methyl ether acetate and ethyl lactate and discloses formamide, ethylene carbonate, dipropylene glycol, gamma-butyrolactone, dimethyl sulfoxide, acetonitrile, n-butyl benzyl phthalate, diethylene glycol, dimethyl phthalate, acetophenone, methoxypropyl acetamide, N,N-dimethylacetamide, ethylene glycol, ethyl cinnamate, diethyl phthalate, N-methylmorpholine, benzonitrile, ethylene glycol 2-ethylhexyl ether, benzyl alcohol, morpholine, ethylene glycol diacetate, propylene glycol, 1,4-dioxane, furfuryl alcohol, cyclohexanone, propylene glycol butyl ether, ethylene glycol monoethyl ether, diethylene glycol ethyl ether, ethylene glycol ethyl ether, ethyl-3-ethoxypropionate, ethylene glycol methyl ether, propyleneglycol methyl ether, N-ethylmorpholine, methyl n-propyl ketone, mesitylene, diethylene glycol ethyl ether acetate, diethyleneglycol methyl ether, cyclohexanol, 4-methyl-3-penten-2-one, 2-methyl-2,4-pentanediol, ethyl benzene, 1-decanol, 1-isopropyl-2-methylimidazole, ethyl lactate, 2-hexyl acetate, diethylene glycol butyl ether acetate, diethylketone, 1-methoxy-2-butanol, diethylene glycol butyl ether, or a combination comprising at least one of the foregoing solvents as preferred solvents.

Conductive inks can be either organic- or metal-based. Metal-based conductive inks are mainly based on dispersions of silver or copper particles (see e.g. WO 00/29208), or precursor materials thereof (see e.g. US 2003/0124259A).

Water-based and solvent-based inks for printing conductive (electrode) patterns of intrinsically conductive polymers on flexible substrates are disclosed, for example, in WO 99/34371, WO 02/00759A, WO 02/079316A, WO 02/080627A, WO 03/000765, WO 03/048228A and WO 03/048229A and screen printing inks are commercially available e.g. Orgacon® EL-P3040 from AGFA-GEVAERT N.V. WO 03/000765A and EP 1 415 826A disclose flexographic and offset printing techniques respectively with inks containing intrinsically conductive polymers. The inkjet printing of PEDOT:PSS dispersions is described for example in Nature Mat. 2004, vol. 3, 171-176, and in Adv. Mater. 2004, vol. 16 (3), 203-213. However, there is a considerable technological difference between the printing of individual layers of a memory device using a conventional printing technique and the production of a fully printed memory device in which all the functional layers necessary for the operation of the memory device are printed by a conventional printing technique.

ASPECTS OF THE INVENTION

It is therefore an aspect of the present invention to provide inexpensive non-volatile memory elements.

It is therefore a further aspect of the present invention to provide inexpensive fully organic non-volatile memory elements.

It is a still further aspect of the present invention to realize an easy and inexpensive means of storing information which can be easily incorporated in a tag, label or package printing process or as part of the packaging process itself.

It is also an aspect of the present invention to realize an easy and inexpensive means of storing information which is capable of lending itself to environmentally friendly disposal.

It is also an aspect of the present invention to realize a rewritable memory device, comprising a first electrode pattern, a ferroelectric pattern or layer and a second electrode pattern and in which all layers are printed using conventional printing processes.

It is also an aspect of the present invention to use printing inks for the conducting electrode patterns and for the ferroelectric polymer layer or pattern which can be dried in a short time, allowing the printing of the memory devices at high speeds.

Further aspects and advantages of the invention will become apparent from the description hereinafter.

SUMMARY OF THE INVENTION

It has been surprisingly found that passive memory devices based on ferroelectric polymers in which all the functional layers necessary for the operation of the passive memory device are printed by a conventional printing technique can be prepared by means of conventional printing processes and moreover that fully organic passive memory devices based on ferroelectric polymers in which all the functional layers necessary for the operation of the passive memory device are printed by a conventional printing technique can be prepared by means of conventional printing processes. The primary object of this invention is to provide a ferroelectric passive memory cell, which can be manufactured by means of conventional impact or non-impact printing processes. Aspects of the present invention are realized by printing a first electrode pattern on a first substrate, printing a layer or pattern of a ferroelectric polymer on the first electrode pattern and optionally printing a second electrode pattern, using conventional printing processes. Either one printing process can be used for all the patterns or layers in the memory device, or a combination of two or more different printing processes can be used. The memory devices may be printed directly on the packaging material prior to, during or after the packaging process. Alternatively, memory devices are printed on labels or tags that are affixed to the package.

Aspects of the present invention are realized by a first passive ferroelectric memory element comprising a first electrode system and a second electrode system, wherein said first electrode system is at least partly insulated from said second electrode system by an element system comprising at least one ferroelectric element, wherein said first electrode system is a conductive surface, or a conductive layer; wherein said second electrode system is an electrode pattern or a plurality of isolated conductive areas in contact with, for read-out or data-input purposes only, a plurality of conducting pins isolated from one another.

Aspects of the present invention are also realized by a first passive memory device comprising at least one passive ferroelectric memory element and at least one substrate at least one of said substrates having at least one conductive surface or surface layer on the at least one side provided with said passive ferroelectric memory element, said passive ferroelectric memory element comprising a first electrode system and a second electrode system, wherein said first electrode system is at least partly insulated from said second electrode system by an element system comprising at least one ferroelectric element, wherein said first electrode system is a conductive surface, or a conductive layer; wherein said second electrode system is an electrode pattern or a plurality of isolated conductive areas in contact with, for read-out and/or data-input purposes only, a plurality of conducting pins isolated from one another; and wherein, with the exception of said first electrode system being the conductive surface of a metallic substrate, said systems are printable using conventional printing processes.

Aspects of the present invention are also realized by a first precursor for said first passive memory device comprising a substrate and on at least one side of said substrate: a conductive surface of said substrate or a conductive layer on said substrate, an element system comprising an organic ferroelectric element on said conductive surface or said conductive layer.

Aspects of the present invention are also realized by a second precursor for said first passive memory device comprising a substrate and on at least one side of said substrate: a conductive surface of said substrate or a conductive layer on said substrate, an element system comprising an organic ferroelectric element on said conductive surface or said conductive layer and a plurality of isolated conductive areas provided for contact, for read-out and/or data-input purposes only, with a plurality of conducting pins isolated from one another.

Aspects of the present invention are realized by a process for providing a first passive memory device comprising at least one passive ferroelectric memory element and at least one substrate at least one of said substrates having at least one conductive surface or surface layer on the at least one side provided with said passive ferroelectric memory element, said passive ferroelectric memory element comprising a first electrode system and a second electrode system, wherein said first electrode system is at least partly insulated from said second electrode system by an element system comprising at least one ferroelectric element, wherein said first electrode system is a conductive surface, or a conductive layer; wherein said second electrode system is an electrode pattern or a plurality of isolated conductive areas in contact with, for read-out and/or data-input purposes only, a plurality of conducting pins isolated from one another; and wherein, with the exception of said first electrode system being the conductive surface of a metallic substrate, said systems are printable using conventional printing processes, comprising the steps of: providing said at least one substrate, realizing said conductive layer on said substrate if the substrate is non-metallic; realizing an element system comprising at least one ferroelectric element on said conductive surface or conductive layer, providing aa electrode pattern or a plurality of isolated conducting areas on said element system, wherein at least one of the steps of optionally providing a conductive layer, providing an element system and providing a plurality of isolated conducting areas is realized with a conventional printing process.

Aspects of the present invention are also realized by a second passive ferroelectric memory element comprising a first electrode system and a second electrode system, wherein said first electrode system is at least partly insulated from said second electrode system by an element system comprising at least one ferroelectric element, wherein said first electrode system is an electrode pattern; and wherein said second electrode system is an electrode pattern and wherein said first electrode system, said second electrode system and said element system are all printable with conventional printing techniques.

Aspects of the present invention are also realized by a second passive memory device, said passive memory device comprising at least one substrate and a passive memory element on at least one side of said at least one substrate, said passive memory element comprising a first patterned electrode system, a second patterned electrode system, an element system comprising at least one ferroelectric element between said first patterned electrode system and said second patterned electrode system; and wherein said second electrode system is an electrode pattern and wherein said first electrode system, said second electrode system and said element system are all printable with conventional printing techniques.

Aspects of the present invention are also realized by a process for providing a second passive memory device, said passive memory device comprising a substrate and a passive memory element on at least one side of said at least one substrate, said passive memory element comprising a first patterned electrode system, a second patterned electrode system, an element system comprising at least one ferroelectric element between said first patterned electrode system and said second patterned electrode system, comprising the steps of: realizing a first electrode pattern on a non-conductive surface of a substrate, providing said element system on said first electrode pattern and providing a second electrode pattern on said element system, wherein the steps of providing a first patterned electrode system, providing an organic ferroelectric layer and providing a second electrode system are all realized with a conventional printing process.

Other features, elements, steps, advantages and characteristics will become apparent from the following detailed description of preferred embodiments thereof with reference to the attached drawings.

DETAILED DESCRIPTION OF THE INVENTION

Definitions

Figure 1:
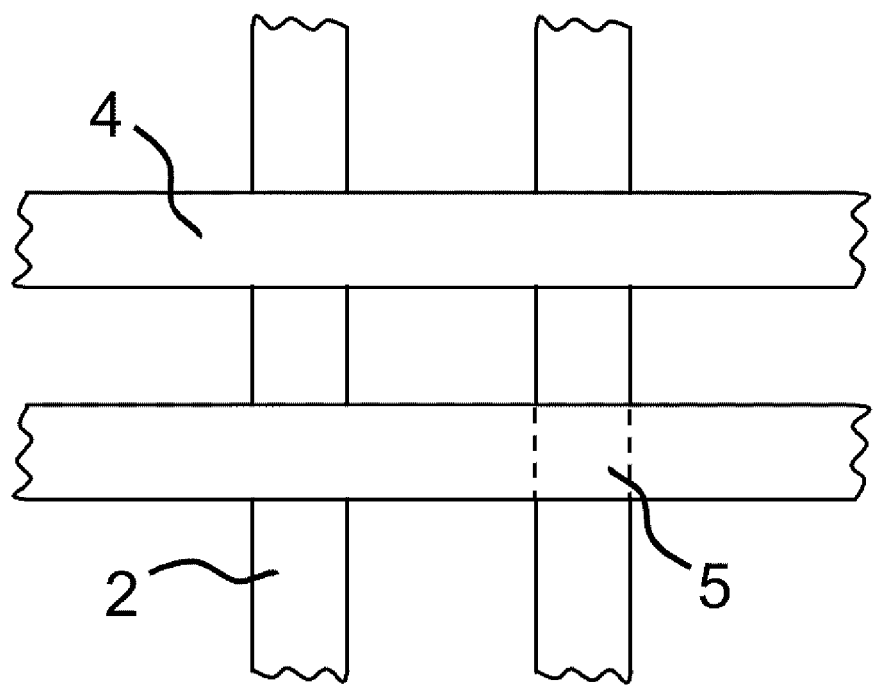
FIG. 1: a schematic top view of a general embodiment of a memory device with a passive electrode matrix, according to the present invention.

The term "substrate", as used in disclosing the present invention, means a "self-substrateing material" so as to distinguish it from a "layer" which may be coated on a substrate, but which is itself not self-supporting. It also includes any treatment necessary for, or layer applied to aid e.g. adhesion to layers or patterns which are applied to the substrate.

The term "pattern", as used in disclosing the present invention, means a non-continuous layer which can be in any form of lines, squares, circles or any random configuration.

The term "layer", as used in disclosing the present invention, means a coating covering the whole area of the entity referred to e.g. a substrate.

The term printable, as used in disclosing the present invention, means capable of being printed by conventional impact and/or non-impact printing processes and includes processes in which a conductive surface layer is patterned, for example by oxidation or reduction, during the printing process as disclosed, for example in EP-A 1 054 414 and WO 03/025953A, but excludes processes such as evaporation, etching, diffusion processes used in the production of conventional electronics e.g. silicon-based electronics.

The term "printing process", as used in disclosing the present invention refers to as well impact printing as to non-impact printing. The term includes but is not restricted to ink-jet printing, intaglio printing, screen printing, flexographic printing, driographic printing, electrophotographic printing, electrographic printing, offset printing, stamp printing, gravure printing, thermal and laser-induced processes and also includes a printing process rendering areas of a conductive layer non-conductive in a single pass process, such as disclosed in EP 1 054 414A and WO 03/025953A, but excludes processes such as evaporation, etching, diffusion processes used in the production of conventional electronics e.g. silicon-based electronics.

The term impact printing process, as used in disclosing the present invention, means a printing process in which contact is made between the medium in which the print is produced and the printing system e.g. printers that work by striking an ink ribbon such as daisy-wheel, dot-matrix and line printers, and direct thermal printers in which the thermographic material is printed by direct contact with heating elements in a thermal head and printers in which a master is covered with an ink layer on areas corresponding to a desired image or shape, after which the ink is transferred to the medium, such as offset, gravure or flexographic printing.

The term non-impact printing process, as used in disclosing the present invention, means a printing process in which no contact is made between the medium in which the print is produced and the printing system e.g. electrographic printers, electrophotographic printers, laser printers, ink jet printers in which prints are produced without needing to strike the print medium.

The term "flexible", as used in disclosing the present invention, means capable of following the curvature of a curved object such as a drum without being damaged.

The term "intrinsically conductive polymer", as used in disclosing the present invention, means organic polymers which have (poly)-conjugated π-electron systems (e.g. double bonds, aromatic or heteroaromatic rings or triple bonds) and whose conductive properties are not influenced by environmental factors such as relative humidity.

PEDOT, as used in disclosing the present invention, represents poly(3,4-ethylenedioxythiophene).

PSS, as used in disclosing the present invention, represents poly(styrene sulfonic acid) or poly(styrene sulfonate).

PANI, as used in disclosing the present invention, represents polyaniline.

Carbon black and carbon, as used in disclosing the present invention, are regarded as organic in nature.

The term "word line", as used in disclosing the present invention, means a line electrode in a substantially parallel line electrode pattern on one side of the ferroelectric polymer layer.

The term "bit line", as used in disclosing the present invention, means a line electrode in a substantially parallel line pattern on the other side of the ferroelectric polymer layer to the word lines with the substantially parallel line pattern of the bit lines being substantially orthogonal to the substantially parallel line pattern of the word lines.

The term "passive", as used in disclosing the present invention. indicates the absence of an active component such as a transistor.

The term "non-volatile memory", as used in disclosing the present invention, means that the memory content is retained without power.

The term "element system". as used in disclosing the present invention, means a system comprising at least one element. The term "organic ferroelectric element", as used in disclosing the present invention, means a part of an element system which has an organic ferroelectric composition. Other parts of the element system can either be voids or be insulating elements not having ferroelectric properties under read-out or data-input conditions.

First Passive Memory Element—Configuration

Aspects of the present invention are realized by a first passive ferroelectric memory element comprising a first electrode system and a second electrode system, wherein said first electrode system is at least partly insulated from said second electrode system by an element system comprising at least one ferroelectric element, wherein said first electrode system is a conductive surface, or a conductive layer; wherein said second electrode system is an electrode pattern or a plurality of isolated conductive areas in contact with, for read-out or data-input purposes only, a plurality of conducting pins isolated from one another.

According to a first embodiment of the first passive ferroelectric memory element, according to the present invention, said second electrode system comprises a plurality of conducting pins, which are part of a read-out and/or data-input device.

According to a second embodiment of the first passive ferroelectric memory element, according to the present invention, said passive memory element only comprises organic materials.

According to a third embodiment of the first passive ferroelectric memory element, according to the present invention, said element system further comprises voids resulting in contact between said first and said second electrode systems.

According to a fourth embodiment of the first passive ferroelectric memory element, according to the present invention, the element system further comprises insulating elements not having ferroelectric properties.

The passive memory cells according to the present invention can be employed as a memory device in a matrix-addressable array of memory cells as shown in FIG. 1. Such a memory device consists of an organic ferroelectric layer 3, each side of which is contacted with an electrode pattern 2 and 4. Both electrode patterns are preferably strip-like and are oriented substantially orthogonally to one another, thereby presenting word lines and bit lines Each intersection between a first electrode line and a second electrode line defines a memory cell 5. Since no transistors are present in this memory device, it can be termed passive.

Figure 2:
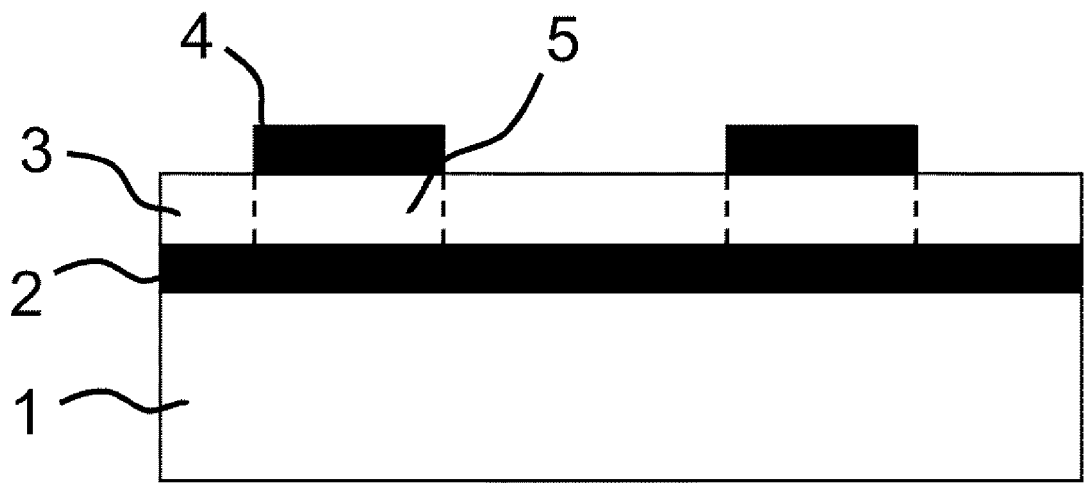
FIG. 2: a cross section of the general embodiment of a memory device with a passive electrode memory device shown in FIG. 1.

FIG. 2 shows a further schematic view of the device shown in FIG. 1, in which the element comprises a substrate 1, a first electrode pattern 2, a continuous organic ferroelectric layer 3 and a second electrode pattern 4. A memory cell is formed at each electrode crossing. Thus memory cell selectivity is provided on an array-wide basis using a defined operating window of electrical stimuli applied via the bit lines and word lines.

According to a fifth embodiment of the first passive ferroelectric memory element, according to the present invention, the second electrode pattern is printed on a second substrate and subsequently brought into contact with the ferroelectric polymer layer in order to form a ferroelectric passive memory element.

According to a sixth embodiment of the first passive ferroelectric memory element, according to the present invention, the memory element consists of a first electrode and the element system is an organic ferroelectric layer. Electrical addressing is achieved by using a readout device with a number of pins, corresponding to the number of memory cells and the geometric configuration of the memory cell array. The array of pins corresponds to the second electrode pattern.

According to a seventh of the first passive ferroelectric memory element, according to the present invention, the first or second electrode is a continuous conductive surface or a conductive layer.

According to a ninth embodiment, the element comprises a substrate, a first electrode pattern, an element system consisting of an organic ferroelectric layer pattern and a second electrode pattern. The ferroelectric polymer pattern may consist of areas of the ferroelectric polymer which are located at each electrode crossing without forming a continuous layer. A memory cell is formed at each electrode crossing.

Figure 3:
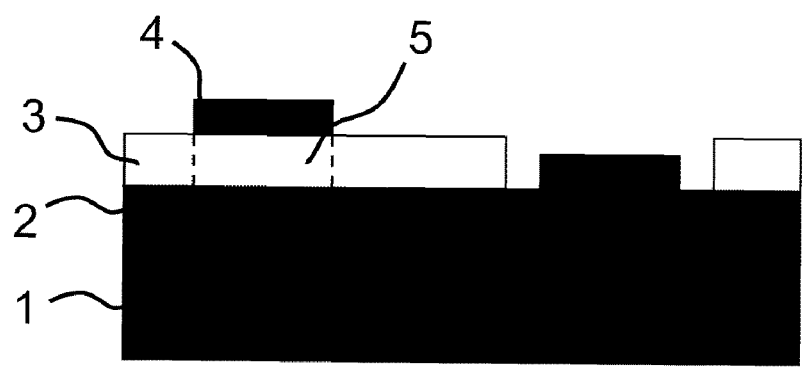
FIG. 3: a cross section of a sixth embodiment of the passive matrix memory device, according to the present invention.

FIG. 3 shows a tenth embodiment in which the element comprises a substrate 1, a first electrode pattern 2, an element system comprising at least one organic ferroelectric element 3 and a second electrode pattern 4. The ferroelectric polymer is applied as a pattern in which the ferroelectric polymer is located at some but not all electrode crossings. A ferroelectric memory cell 5 is only formed at electrode crossings in which the ferroelectric polymer is present. The remaining electrode crossings will be shortcircuited and will thus not show ferroelectric behavior. In this way, information can be stored permanently in the memory device during manufacturing. This information can be used as a security feature against counterfeiting of or tampering of with such a device.

Figure 4A:
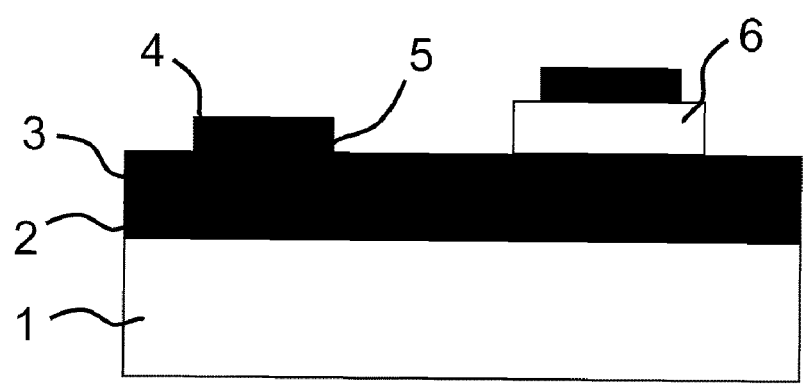
FIG. 4A-B: two cross sections of a seventh embodiment of the passive matrix memory device, according to the present invention.
Figure 4B:
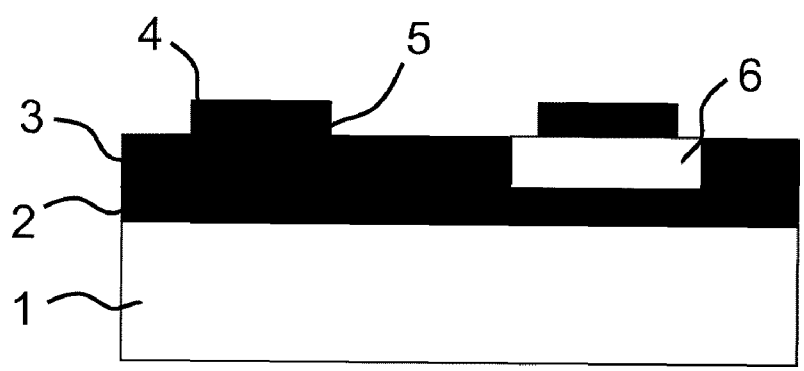

FIG. 4 shows an eleventh embodiment, the element comprising a substrate 1, a first electrode pattern 2, a continuous layer or a pattern of an organic ferroelectric composition 3, a pattern of an insulating material 6 with no ferroelectric properties at the swept voltages for read-out and a second electrode pattern 4. The isolating material may be applied either above or beneath the ferroelectric polymer at predesignated electrode crossings (FIG. 4a) or at electrode crossings where no ferroelectric polymer is present (FIG. 4b). The insulating material will not show ferroelectric behavior, thus information can be stored permanently in the memory device during manufacturing. The insulating material can be a solvent-based, water-based or UV-curable ink or a solution of an inorganic, organic or polymeric material in a suitable solvent. The insulating material can even be a ferroelectric material, which does not exhibit significant ferroelectric behavior at the voltages used for read/write operations i.e. if applied in a sufficiently thick layer.

According to a twelfth embodiment, the size and/or layer thickness of the insulating system may be varied to give a range of impedances, hence giving additional bit levels. The variation of impedances of an insulating material in a passive matrix has already been described in, for example, WO 99/14, 762 and U.S. Pat. No. 6,236,587 which are hereby incorporated by reference.

The information stored in the memory element by using shortcircuits and insulating materials is not readily rewritable but is 'written' at the moment the device is manufactured. This information can be invisible to the naked (unaided) eye, e.g. if the ferroelectric polymer and element system are transparent, making it more difficult to falsify the memory device.

Provided with the suitable electrical circuitry, the readout of information might be in direct contact, capacitive or inductive. Capacitive readout of ferroelectric passive memory devices is e.g. described in U.S. Pat. No. 6,611,448, which is hereby incorporated by reference.

First Passive Memory Device

Aspects of the present invention are realized by a first passive memory device comprising at least one passive ferroelectric memory element and at least one substrate at least one of said substrates having at least one conductive surface or surface layer on the at least one side provided with said passive ferroelectric memory element, said passive ferroelectric memory element comprising a first electrode system and a second electrode system, wherein said first electrode system is at least partly insulated from said second electrode system by an element system comprising at least one ferroelectric element, wherein said first electrode system is a conductive surface, or a conductive layer; wherein said second electrode system is an electrode pattern or a plurality of isolated conductive areas in contact with, for read-out and/or data-input purposes only, a plurality of conducting pins isolated from one another; and wherein, with the exception of said first electrode system being the conductive surface of a metallic substrate, said systems are printable using conventional printing processes.

According to a first embodiment of the first passive memory device, according to the present invention, said element system further comprises voids resulting in contact between said first and said second electrode systems.

According to a second embodiment of the first passive memory device, according to the present invention, said element system further comprises insulating elements not having ferroelectric properties.

According to a third embodiment of the first passive memory device, according to the present invention, said first passive memory device is exclusive of metallic silicon.

According to a fourth embodiment of the first passive memory device, according to the present invention, said second electrode system is an electrode pattern on a second substrate.

According to a fifth embodiment of the first passive memory device, according to the present invention, said electrode pattern on said second substrate is laminated to said element system comprising at least one ferroelectric element thereby forming a device sandwiched between two substrates.

According to a sixth embodiment of the first passive memory device, according to the present invention, said electrode pattern on said second substrate is brought into contact with said element system for read-out and/or data-input purposes only.

According to a seventh embodiment of the first passive memory device, according to the present invention, said first passive memory device is transparent.

According to a ninth embodiment of the first passive memory device, according to the present invention, said passive ferroelectric memory device is overprinted with an image or a homogeneously coloured or opaque layer to visually hide said electrode systems.

According to a tenth embodiment of the first passive memory device, according to the present invention, a coloured or opaque foil is laminated over said passive ferroelectric memory device to visually hide the location of said electrode systems.

According to an eleventh embodiment of the first passive memory device, according to the present invention, at least one of said first and second patterned electrode systems comprises an inorganic conducting medium or an organic conducting medium.

According to a twelfth embodiment of the first passive memory device, according to the present invention, said organic conducting medium is an intrinsically conductive organic polymer.

According to a thirteenth embodiment of the first passive memory device, according to the present invention, said intrinsically conductive organic polymer is a substituted or unsubstituted polythiophene, a substituted or unsubstituted polyaniline or a substituted or unsubstituted polypyrrole, with a preferred substituted polythiophene being a poly(3,4-dioxyalkylenethiophene) and a particularly preferred substituted polythiophene being poly(3,4-dioxyethylenethiophene).

The electrodes may be a conducting or semiconducting material. Conductive and semiconductive materials can be dispersed or dissolved to form inks, e.g. based on conductive metals (e.g. silver paste), conductive metal alloys, conductive metal oxides, carbon black, semiconductive metal oxides and intrinsically conductive organic polymers (e.g. polyaniline, PEDOT). Conductive inks based on intrinsically conductive organic polymers are preferred with inks based on PEDOT: PSS being particularly preferred due to its low absorption of visible light and since it lends itself for environmentally friendly disposal.

Process for Providing a First Passive Memory Device

Aspects of the present invention are realized by a process for providing a first passive memory device comprising at least one passive ferroelectric memory element and at least one substrate at least one of said substrates having at least one conductive surface or surface layer on the at least one side provided with said passive ferroelectric memory element, said passive ferroelectric memory element comprising a first electrode system and a second electrode system, wherein said first electrode system is at least partly insulated from said second electrode system by an element system comprising at least one ferroelectric element, wherein said first electrode system is a conductive surface, or a conductive layer; wherein said second electrode system is an electrode pattern or a plurality of isolated conductive areas in contact with, for read-out and/or data-input purposes only, a plurality of conducting pins isolated from one another; and wherein, with the exception of said first electrode system being the conductive surface of a metallic substrate, said systems are printable using conventional printing processes, comprising the steps of: providing said at least one substrate, realizing said conductive layer on said substrate if the substrate is non-metallic; realizing an element system comprising at least one ferroelectric element on said conductive surface or conductive layer, providing a plurality of isolated conducting areas on said element system, wherein all the steps of optionally providing a conductive layer, providing an element system and providing a plurality of isolated conducting areas are realized with at least one conventional printing process.

According to a first embodiment of the process for providing a first passive memory device, according to the present invention, said at least one conventional printing process is a non-impact printing process.

According to a second embodiment of the process for providing a first passive memory device, according to the present invention, said at least one conventional printing process is an impact printing process.

According to a third embodiment of the process for providing a first passive memory device, according to the present invention, said conventional printing process is selected from the group consisting of ink-jet printing, intaglio printing, screen printing, flexographic printing, offset printing, stamp printing, gravure printing, electrophotographic printing, electrographic printing and thermal and laser-induced processes.

According to a fourth embodiment of the process for providing a first passive memory device, according to the present invention, said first and second electrode systems comprise an intrinsically conductive polymer, which can be a substituted or unsubstituted polythiophene, a substituted or unsubstituted polyaniline or a substituted or unsubstituted polypyrrole. A particularly preferred substituted or unsubstituted thiophene is represented by formula (I):

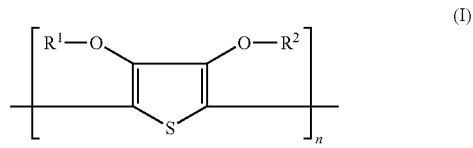

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

According to a fifth embodiment of the process for providing a first passive memory device, according to the present invention, said passive memory element only comprises organic materials.

According to a sixth embodiment of the process for providing a first passive memory device, according to the present invention, the first electrode pattern, the element system and the second electrode pattern are each performed by a conventional printing process which can be the same or different.

According to a seventh embodiment of the process for providing a first passive memory device, according to the present invention, the first electrode pattern, the element system and the second electrode pattern are performed by the same conventional printing process.

According to an eighth embodiment of the process for providing a first passive memory device, according to the present invention, said element system further comprises voids resulting in contact between said first and said second electrode systems.

According to a ninth embodiment of the first passive memory device, according to the present invention, said element system further comprises insulating elements not having ferroelectric properties under read-out or data-input conditions.

According to a tenth embodiment of the process for providing a first passive memory device, according to the present invention, multiple layers of a ferroelectric memory device can be printed over each other. Such a device with stacked polymer layers, prepared via lithography instead of printing, has already been described in US patent 2003/0,218,191 and is hereby incorporated by reference in its entirety.

In order to be able to print at high speeds, drying times of all the printed patterns or layers have to be as short as possible.

The minimum dimensions of the printed patterns are determined by the printing process chosen, involving both the dimensions of the printed features and the distance between the printed features. The tolerance in the positioning of subsequently printed patterns or layers is also determined by these dimensions and hence depends on the printing process. In addition, the minimum practical dimensions are determined by the electronic control unit for the writing and read-out of information. Writing and readout of the information can be performed by bringing the memory device and an appropriate electronic control unit for driving and detecting the electrical state of the memory cells in contact with one another. To facilitate the alignment of the memory device and the electronic control unit, contact pads need to be sufficiently large and separated by a significant distance to minimize the possibility of misalignment of the memory device relative to the electronic control unit.

Process for Providing a Second Passive Memory Device

Aspects of the present invention are realized by a process for providing a second passive memory device, said passive memory device comprising a substrate and a passive memory element on at least one side of said substrate, said passive memory element comprising a first patterned electrode system, a second patterned electrode system, an element system comprising at least one ferroelectric element between said first patterned electrode system and said second patterned electrode system, comprising the steps of: realizing a first electrode pattern on a non-conductive surface of a substrate, providing an organic ferroelectric layer on said first electrode pattern and providing a second electrode pattern on said insulating pattern, wherein the steps of providing a first patterned electrode system, providing an organic ferroelectric layer and providing a second electrode system are all realized with a conventional printing process.

According to a first embodiment of the process for providing a second passive memory device, according to the present invention, said provision of said first patterned electrode system includes patterning a pre-coated conductive layer in a one pass printing step. In a preferred embodiment said pre-coated conductive layer comprises an intrinsically conductive polymer.

According to a second embodiment of the process for providing a second passive memory device, according to the present invention, said first and second electrode systems comprise an intrinsically conductive polymer, which can be a substituted or unsubstituted polythiophene, a substituted or unsubstituted polyaniline or a substituted or unsubstituted polypyrrole. A particularly preferred substituted or unsubstituted thiophene is represented by formula (I):

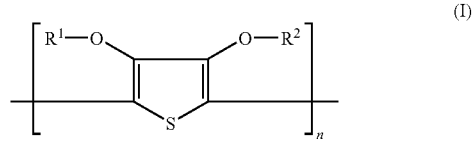

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

According to a third embodiment of the process for providing a second passive memory device, according to the present invention, said passive memory element only comprises organic materials.

According to a fourth embodiment of the process for providing a second passive memory device, according to the present invention, said at least one conventional printing process is a non-impact printing process e.g. ink-jet printing, electrophotographic printing and electrographic printing.

According to a fifth embodiment of the process for providing a second passive memory device, according to the present invention, said at least one conventional printing process is an impact printing process e.g. offset printing, screen printing, flexographic printing, and stamp printing.

According to sixth embodiment of the process for providing a second passive memory device, according to the present invention, the at least one conventional printing process is selected from the group consisting of ink-jet printing, intaglio printing, screen printing, flexographic printing, offset printing, stamp printing, gravure printing, electrophotographic printing, electrographic printing, thermal and laser-induced processes and includes processes in which a conductive surface layer is patterned, for example by oxidation or reduction, during the printing process.

According to a seventh embodiment of the process for providing a second passive memory device, according to the present invention, the first electrode pattern, the insulating system and the second electrode pattern are each performed by a conventional printing process which can be the same or different.

According to an eighth embodiment of the process for providing a second passive memory device, according to the present invention, the first electrode pattern, the insulating system and the second electrode pattern are performed by the same conventional printing process.

According to a ninth embodiment of the process for providing a second passive memory device, according to the present invention, the substrate is a flexible or rigid plastic, glass, paper, board, carton or a composite material of any of these materials.

According to a tenth embodiment of the process for providing a second passive memory device, according to the present invention, multiple layers of a ferroelectric memory device can be printed over each other. Such a device with stacked polymer layers, prepared via lithography instead of printing, has already been described in US patent 2003/0,218,191 and is hereby incorporated by reference in its entirety.

According to an eleventh embodiment of the process for providing a second passive memory device, according to the present invention, said element system further comprises voids resulting in contact between said first and said second electrode systems.

According to a twelfth embodiment of the process for providing a second passive memory device, according to the present invention, said element system further comprises insulating elements not having ferroelectric properties under read-out or data-input conditions.

In order to be able to print at high speeds, drying times of all the printed patterns or layers have to be as short as possible.

The minimum dimensions of the printed patterns are determined by the printing process chosen, involving both the dimensions of the printed features and the distance between the printed features. The tolerance in the positioning of subsequently printed patterns or layers is also determined by these dimensions and hence depends on the printing process. In addition, the minimum practical dimensions are determined by the electronic control unit for the writing and read-out of information. Writing and readout of the information is performed by bringing the memory device and an appropriate electronic control unit for driving and detecting the electrical state of the memory cells in contact with each other. To facilitate the alignment of the memory device and the electronic control unit, contact pads need to be sufficiently large and separated by a significant distance to minimize the possibility of misalignment of the memory device relative to the electronic control unit.

Organic Ferroelectric Composition

The memory material in the memory cells is an organic ferroelectric composition, e.g. comprising polyvinylidene fluoride, copolymers of vinylidene fluoride particularly copolymers of vinylidene fluoride with trifluoroethylene, hexafluoropropylene, or both; odd-numbered nylons, odd-numbered nylons and their copolymers; cyanopolymers such as polyvinylidene cyanide (PVCN), copolymers of vinylidene cyanide, such as copolymers with vinyl acetate; polyureas; polythioureas; and polymers with strongly polarizable endgroups. Optimization of materials can take place using copolymers, terpolymers and blends (e.g. with polymethylmethacrylate PMMA). In a preferred embodiment the organic ferroelectric composition is a blend composed of 50 wt % g-elastomer and 50 wt % of piezoelectric poly(vinylidenefluoride-trifluoroethylene).

Particularly preferred organic ferroelectric compositions comprise copolymers of vinylidene fluoride with 10 to 100 mole % vinylidene fluoride based on the total weight of the ferroelectric polymer. Within this range, a vinylidene fluoride concentration of at least 50 mole % is preferred with a concentration of at least 70 mole % being particularly preferred. Trifluoroethylene preferably comprises up to 90 mole % of the total ferroelectric polymer. Within this range, a trifluoroethylene concentration of at least 10 mole % it preferred with a concentration of at least 29 mole % being particularly preferred. Hexafluoropropylene preferably comprises up to 50 mole % of the total weight of the ferroelectric polymer. A hexafluoroethylene concentration of at least 10 mole % can be employed with at least 15 mole % being particularly preferred. Ferroelectric polymers have a molecular weight in the range of 5,000 to 250,000, with molecular weights of at least 20,000 being preferred and of at least 30,000 being particularly preferred, with molecular weights preferably not being greater than 80,0000 and particularly preferably not being greater than 60,000.

In the case of the use of organic ferroelectric layers comprising copolymers of vinylidene fluoride and trifluoroethylene, the organic ferroelectric layer is preferably annealed at a temperature of about 140° C. to optimize its ferroelectric properties.

The organic ferroelectric layer preferably has a layer thickness of 1 µm or less.

Conductive Screen Printing Inks

WO-A 02/079316 discloses an aqueous composition containing a polymer or copolymer of a 3,4-dialkoxythiophene in which the two alkoxy groups may be the same or different or together represent an optionally substituted oxy-alkyleneoxy bridge, a polyanion and a non-Newtonian binder; a method for preparing a conductive layer comprising: applying the above-described aqueous composition to an optionally subbed substrate, a dielectric layer, a phosphor layer or an optionally transparent conductive coating; and drying the thereby applied aqueous composition; antistatic and electroconductive coatings prepared according to the above-described method for preparing a conductive layer; a printing ink or paste comprising the above-described aqueous composition; and a printing process comprising: providing the above-described printing ink; printing the printing ink on an optionally subbed substrate, a dielectric layer, a phosphor layer or an optionally transparent conductive coating. The screen printing ink formulations disclosed in WO-A 02/079316 are specifically incorporated herein by reference.

WO-A 03/048228 discloses a method for preparing a composition containing between 0.08 and 3.0% by weight of polymer or copolymer of a 3,4-dialkoxythiophene in which the two alkoxy groups may be the same or different or together represent an optionally substituted oxy-alkylene-oxy bridge, a polyanion and at least one non-aqueous solvent from a dispersion of the polymer or copolymer of (3,4-dialkoxythiophene) and the polyanion in water which is prepared in the substantial absence of oxygen, comprising in the following order the steps of: i) mixing at least one of the non-aqueous solvents with the aqueous dispersion of the polymer or copolymer of (3,4-dialkoxythiophene) and the polyanion; and ii) evaporating water from the mixture prepared in step i) until the content of water therein is reduced by at least 65% by weight; a printing ink, printing paste or coating composition, capable of yielding layers with enhanced conductivity at a given transparency, prepared according to the above-described method; a coating process with the coating composition thereby producing a layer with enhanced conductivity at a given transparency; and a printing process with the printing ink or paste thereby producing a layer with enhanced conductivity at a given transparency. The screen printing ink formulations disclosed in WO-A 03/048228 are specifically incorporated herein by reference.

WO-A 03/048229 discloses a method for preparing a composition containing between 0.08 and 3.0% by weight of a polymer or copolymer of a 3,4-dialkoxythiophene in which the two alkoxy groups may be the same or different or together represent an oxy-alkylene-oxy bridge optionally substituted with substituents selected from the group consisting of alkyl, alkoxy, alkyoxyalkyl, carboxy, alkylsulphonato, alkyloxyalkylsulphonato and carboxy ester groups, a polyanion and at least one polyhydroxy non-aqueous solvent from a dispersion of the polymer or copolymer of (3,4-dialkoxythiophene) and the polyanion in water comprising in the following order the steps of: i) mixing at least one of the non-aqueous solvents with the aqueous dispersion of the polymer or copolymer of (3,4-dialkoxythiophene) and the polyanion; and ii) evaporating water from the mixture prepared in step i) until the content of water therein is reduced by at least 65% by weight; a printing ink, printing paste or coating composition, capable of yielding layers with an enhanced transparency at a given surface resistance, prepared according to the above-described method; a coating process with the coating composition thereby producing a layer with enhanced transparency at a given surface resistance; and a printing process with the printing ink or paste thereby producing a layer with enhanced transparency at a given surface resistance. The screen printing ink formulations disclosed in WO-A 03/048229 are specifically incorporated herein by reference.

Conductive Flexographic Printing Inks

WO-A 03/000765 discloses a non-dye containing flexographic ink containing a polymer or copolymer of a 3,4-dialkoxythiophene in which the two alkoxy groups may be the same or different or together represent an optionally substituted oxy-alkylene-oxy bridge, a polyanion and a latex binder in a solvent or aqueous medium, characterized in that the polymer or copolymer of a 3,4-dialkoxythiophene is present in a concentration of at least 0.1% by weight in the ink and that the ink is capable of producing a colorimetrically additive transparent print; a method of preparing the flexographic ink; and a flexographic printing process therewith. The flexographic printing ink formulations disclosed in WO-A 03/000765 are specifically incorporated herein by reference.

Conductive Inkjet Printing Inks

Formulations containing a polymer or copolymer of a 3,4-dialkoxythiophene in which the two alkoxy groups may be the same or different or together represent an optionally substituted oxy-alkylene-oxy bridge, a polyanion and a high boiling point liquid in a solvent or aqueous medium can be prepared, which are suitable for inkjet printing. Critical properties, such as the viscosity which at the jetting temperature is preferably in the range of 3 to 15 mPa·s for a Universal Print Head (from AGFA-GEVAERT), can be adjusted by changing the concentration of conductive polymer and the amount and type of high boiling point liquid. A 1.2% PEDOT:PSS solution has a viscosity of approx. 30 mPa·s and approx 10 mPa·s at a concentration of 0.6%.

The surface tension is preferably in the range of 28 to 36 mN/m under jetting conditions for a Universal Print Head, and can be adjusted by adding appropriate anionic, cationic or non-ionic surfactants or solvents, e.g. alcohols. Surfactants can also influence the jetting performance, wetting properties of the ink on a substrate and the UV-stability of printed layers.

The addition of for example 5-20% by weight of high boiling point liquids improves the conductivity of the printed layer after drying; useful high boiling point liquids include ethylene glycol, diethylene glycol, propylene glycol, glycerol, N-methylpyrrolidone and 2-pyrrolidon. The choice of high boiling point liquid also has an influence on drying time, minimum drying temperature, jetting performance, wetting properties, viscosity and surface tension. Optionally, volatile bases, such as dimethylethanol amine, triethylamine or diisopropylethylamine might be added to neutralize the inkjet printing solution to prevent corrosion of the print head.

INDUSTRIAL APPLICATION

The passive memory devices, according to the present invention, can be used in security and anti-counterfeiting applications e.g. in tickets, labels, tags, an ID-card, a bank card, a legal document, banknotes and can also be integrated into packaging.

The invention is illustrated hereinafter by way of COMPARATIVE EXAMPLES and INVENTION EXAMPLES. The percentages and ratios given in these examples are by weight unless otherwise indicated.

Ingredients used in non-commercial coatings used in the elements of the INVENTION EXAMPLES:

| COPOLYMER 1 | = | Copolymer of 57 mol % of vinylidene fluoride and 43 mol % of trifluoroethylene from PIEZOTECH S.A. |
| --- | --- | --- |
| Polyester dispersion | = | a 25% by weight aqueous dispersion of a polyester of 52.9 mol % terephthalic acid, 40 mol % isophthalic acid, 7 mol % sulfo-isophthalic acid, 0.1 mol % of 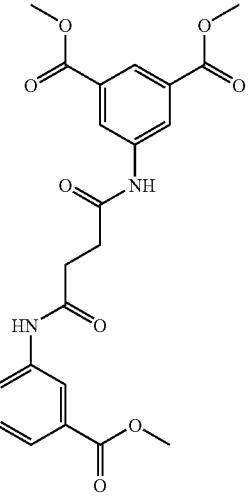 and 100 mol % ethylene glycol |
| TANACOTE ® FG3 | = | an aqueous carboxylated polypropylene emulsion from SYBRON CHEMICALS |
| PANIPOL ® W | = | a 6% by weight aqueous dispersion of polyaniline from PANIPOL LTD. |
| DYNOL ® 604 | = | an acetylenic glycol-based surfactant from polyaniline AIR PRODUCTS |
| ZONYL ®FSO100 | = | a 5 wt. % solution of a block copolymer of poly-ethyleneglycol and polytetrafluoroethene with the structure: $F(CF_2CF_2)_y CH_2CH_2O(CH_2CH_2O)_x H$, where x = 0 to ca. 15 and y = 1 to ca. 7 from DU PONT |

Ink Compositions Used:

The compositions of the flexographic and ink-jet inks used in preparing the INVENTION EXAMPLES are summarized in Table 1, 2 and 3 below respectively.

TABLE 1

Composition flexographic PEDOT ink

| | Concentration |
| --- | --- |
| 3% aqueous dispersion of PEDOT:PSS | 45.0% |
| Deionized water | 14.0% |
| Aqueous dispersion of polyester | 5.6% |
| Tanacote ® FG3 | 1.4% |
| 1,2-propaandiol | 1.6% |
| Diethylene glycol monomethyl ether | 2.9% |
| Diethylene glycol (DEG) | 4.5% |
| Dibutyl sebacate | 5.0% |
| isopropanol | 20.0% |

TABLE 2

Composition of the PEDOT:PSS ink-jet ink

| | Concentration |
| --- | --- |
| PEDOT:PSS 1.1% aqueous dispersion | 57.10% |
| Deionized water | 28.55% |
| N-methyl pyrrolidone | 14.20% |
| Dynol ® 604 | 0.15% |
| Dimethylethanolamine | to increase pH to 7-8 |

TABLE 3

Inks with (ferroelectric) COPOLYMER 1*

| | A) in PGMEA | 20 B) in γ-butyrolactone | C) in γ-butyrolactone |
| --- | --- | --- | --- |
| Copolymer 1 | 2.48 g | 1.5 g | 0.28 g |
| Solvent | 13.97 g | 10.1 g | 3.12 g |
| Concentration | 15.1 % by wt. | 12.9 % by wt. | 8.2 % by weight |

*prepared by mixing the copolymer with the solvent for 1 hour at 80° C.

EXAMPLES

The first electrode, second electrode and ferroelectric layer were prepared using the following printing methods

| printing method nr. | Method of printing |
| --- | --- |
| 1 | Screen printing with an Orgacon ® EL-P3040 paste with a mesh 62 screen on a subbed PET-substrate to a line width of 1 mm followed by drying at 130° C. for 3 minutes |
| 2 | Flexographic printing of a flexo-PEDOT formulation (see table 1) on a subbed PET-substrate, with a Rotary Koater |

-continued

| printing method nr. | Method of printing |
|---|---|
|  | Pilot Press (from R.K. Print Coat Instruments, Ltd.) at 18 m/min to a line width of 1 mm followed by drying in an oven at 109° C. in a roll-to-roll process |
| 3 | Inkjet printing of the PEDOT formulation given in table 2 on a subbed PET-substrate to a line width of 1 mm followed by drying in an oven at 130° C. for 2 minutes |
| 4A 4B 4C | Ferroelectric polymer layer was applied to the bottom electrode by flexoprinting, using an ESIPROOF flexographic handproofer (from R.K. Print Coat Instruments, Ltd.) and subsequent annealing of the layer for 30 minutes at 140° C. In the case of multiple printings each intermediate printing was dried at 140° C. for 2 minutes and the 30 minute annealing at 140° C. was carried out at the end of the last printing. |
| 5 | ThermoKett 2000 (a water-based carbon flexographic ink from Akzo Nobel) was printed on a second subbed PET-substrate using an ESIPROOF flexographic handproofer to a line width of 2 mm and dried at 140° C. for 3 minutes. |
| 6 | Luxprint 7145L (a screenprint silver paste from DU PONT), was screenprinted wet-on-dry on a second subbed PET-substrate to a line width of 2 mm and dried at 130° C. for 15 minutes. |
| 7 | ThermoKett 2000 was applied manually on the layer of ferroelectric copolymer 1 to a line width of 2 mm followed by drying at 3 minutes at 140° C. |
| 8 | Luxprint 7145L was applied manually on the layer of ferroelectric copolymer 1 to a line width of 3 mm followed by drying for 3 minutes at 140° C. |
| 9 | An aqueous dispersion containing 1.1% by weight of PEDOT/PSS, 0.2% by weight of ZONYL ® FSO100 from DU PONT and 1.7% by weight of Z6040 (glycidoxypropyltrimethoxy-silane) from DOW CHEMICAL was applied manually on the layer of ferroelectric copolymer 1 to a line width of 5 mm followed by drying for 3 minutes at 140° C. |
| 10 | PANIPOL ® W an aqueous dispersion of conductive polyaniline from PANIPOL OY was applied manually on a second subbed PET-substrate with a line width of 1 mm followed by drying at 140° C. for 3 minutes. |

INVENTION EXAMPLE 1

Fully Flexo Printed Memory Element on Single Substrate

The passive memory element of INVENTION EXAMPLE 1 was produced by first printing a first PET-substrate with a PEDOT/PSS-electrode pattern having lines 25 mm in length and 1 mm in width using printing method 2. Solution B of ferroelectric copolymer 1 was then applied three times to the first electrode using printing method 4B and was annealed for 35 minutes at 140° C.

ThermoKett 2000 (a water-based carbon flexographic ink from Akzo Nobel) was manually applied on top of the ferroelectric layer and dried at 140° C. for 3 minutes providing the second electrode pattern according to printing method 7 to produce lines 2 mm in width.

Figure 5:
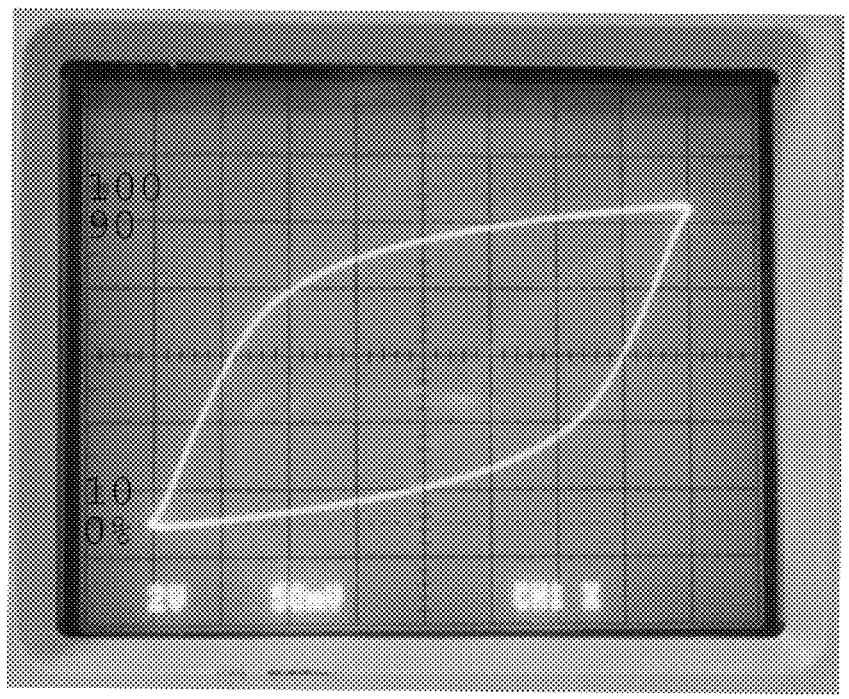
FIG. 5: a typical oscilloscope trace for the passive memory element of INVENTION EXAMPLE 1 with a PEDOT/PSS first electrode applied by flexographic printing, a ferroelectric layer applied by flexographic printing with solution B and a manually applied carbon second electrode with the voltage over a capacitor of 1 µF as the y-axis and the swept voltage as the x-axis.

The ferroelectric measurements were carried out on the passive memory elements of INVENTION EXAMPLE 1 using a Sawyer-Tower circuit [Sawyer C. B., Tower, C. H., Phys. Rev., 35, (1930), pp. 269-273] with the reference capacitor having a capacitance of 1 µF. The electrical signal was generated by a Wavetek 5 MHz function generator model FG-5000A, and amplified by a Powertek Laboratory Power Amplifier LPA400. The result was observed with a Tektronix 2445A 150 MHz oscilloscope. FIG. 5 shows a typical oscilloscope trace, recorded at 50 Hz and a swept voltage of 160V i.e. −80V to +80V showing a potential of 180 mV corresponding to a remnant polarization of 9 µC/cm$^2$.

The passive memory element exhibited a remnant polarization typical for ferroelectric polymers of the type of copolymer 1, see e.g. R. C. G. Naber et al. in Applied Physics Letters, volume 85, pages 2032-2034 (2004), and hence this passive memory element is capable of performing as a passive memory element.

INVENTION EXAMPLES 2 TO 4

Two Part Fully Flexo Printed Memory Elements

The passive memory element of INVENTION EXAMPLES 2 to 4 were produced by first printing a first PET-substrate with a PEDOT/PSS-electrode pattern having lines 25 mm in length and 1 mm in width using printing method 2. Solution A, B and C of ferroelectric copolymer 1 was then applied to the first electrode using printing method 4A, 4B and 4C respectively for the passive memory elements of INVENTION EXAMPLES 2, 3 and 4 respectively and the layers were annealed for 35 minutes at 140° C.

The second electrode pattern was then produced by printing a second subbed PET-substrate with a PEDOT/PSS-electrode pattern having lines 25 mm in length and 1 mm in width using printing method 2.

The final devices were produced by bringing the printed ferroelectric polymer layer on the first substrate into intimate contact with the second electrode pattern by pressing together at room temperature.

The ferroelectric measurements were carried out on the passive memory elements of INVENTION EXAMPLES 2, 3 and 4 respectively as described for the passive memory element of INVENTION EXAMPLE 1. The remnant polarizations were calculated from the potential across the 1 μF capacitor and the swept voltage and frequency together with the potentials and the remnant polarizations calculated therefrom are summarized in Table 4 below.

TABLE 4

| EXAMPLE nr. | First electrode | Copolymer 1 | Second electrode | Swept voltage [V] | Frequency [Hz] | Potential over 1 μF capacitance [mV] | $P_R$ remnant polarization [μC/cm$^2$] |
|---|---|---|---|---|---|---|---|
| 2 | 2 | 4A | 2 | 70 | 50 Hz | 40 | 4.0 |
| 3 | 2 | 4B | 2 | 70 | 50 Hz | 85 | 8.5 |
| 4 | 2 | 4C | 2 | 70 | 50 Hz | 72 | 7.2 |

The passive memory elements of INVENTION EXAMPLES 2, 3 and 4 exhibited remnant polarizations typical for ferroelectric polymers of the type of copolymer 1, see e.g. R. C. G. Naber et al. in Applied Physics Letters, volume 85, pages 2032-2034 (2004), and hence these passive memory elements are capable of performing as passive memory elements.

INVENTION EXAMPLE 5

Two Part Inkjet-Flexo-Inkjet Printed Memory Element

The passive memory element of INVENTION EXAMPLE 5 was produced by first printing a first PET-substrate with a PEDOT/PSS-electrode pattern having lines 25 mm in length and 1 mm in width using printing method 3 (inkjet). Solution A of ferroelectric copolymer 1 was then applied to the first electrode using printing method 4A and the layer was annealed for 35 minutes at 140° C.

The second electrode pattern was then produced by printing a second subbed PET-substrate with a PEDOT/PSS-electrode pattern having lines 25 mm in length and 1 mm in width using printing method 3 (inkjet).

The final device was produced by bringing the printed ferroelectric polymer layer on the first substrate into intimate contact with the second electrode pattern by pressing together at room temperature.

The ferroelectric measurements were carried out on the passive memory element of INVENTION EXAMPLE 5 as described for the passive memory element of INVENTION EXAMPLE 1. The remnant polarizations were calculated from the potential across the 1 μF capacitor and the swept voltage and frequency together with the potentials and the remnant polarizations calculated therefrom are summarized in Table 5 below.

pages 2032-2034 (2004), and hence this passive memory element is capable of performing as a passive memory element.

INVENTION EXAMPLES 6 AND 7

Two Part Inkjet-Flexo-Flexo Printed Memory Element

The passive memory element of INVENTION EXAMPLES 6 and 7 were produced by first printing a first PET-substrate with a PEDOT/PSS-electrode pattern having lines 25 mm in length and 1 mm in width using printing method 3 (inkjet). Solution A and B of ferroelectric copolymer 1 was then applied to the first electrode using printing method 4A and 4B respectively for the passive memory elements of INVENTION EXAMPLES 6 and 7 respectively and the layers were annealed for 35 minutes at 140° C.

The second electrode pattern was then produced by printing a second subbed PET-substrate with a PEDOT/PSS-electrode pattern having lines 25 mm in length and 1 mm in width using printing method 2 (flexographic printing).

The final devices were produced by bringing the printed ferroelectric polymer layer on the first substrate into intimate contact with the second electrode pattern by pressing together at room temperature.

The ferroelectric measurements were carried out on the passive memory element of INVENTION EXAMPLES 6 and 7 as described for the passive memory element of INVENTION EXAMPLE 1. The remnant polarizations were calculated from the potential across the 1 μF capacitor and the swept voltage and frequency together with the potentials and the remnant polarizations calculated therefrom are summarized in Table 6 below.

TABLE 5

| EXAMPLE nr. | First electrode | Copolymer 1 | Second electrode | Swept voltage [V] | Frequency [Hz] | Potential over 1 μF capacitance [mV] | $P_R$ remnant polarization [μC/cm$^2$] |
|---|---|---|---|---|---|---|---|
| 5 | 3 | 4A | 3 | 90 | 50 Hz | 80 | 8.0 |

The passive memory elements of INVENTION EXAMPLE 5 exhibited a remnant polarization typical for ferroelectric polymers of the type of copolymer 1, see e.g. R. C. G. Naber et al. in Applied Physics Letters, volume 85,

TABLE 6

| EXAMPLE nr. | First electrode | Copolymer 1 | Second electrode | Swept voltage [V] | Frequency [Hz] | Potential over 1 µF capacitance [mV] | $P_R$ remnant polarization [µC/cm$^2$] |
|---|---|---|---|---|---|---|---|
| 6 | 3 | 4A | 2 | 80 | 50 Hz | 35 | 3.5 |
| 7 | 3 | 4B | 2 | 80 | 50 Hz | 40 | 4.0 |

Figure 6:
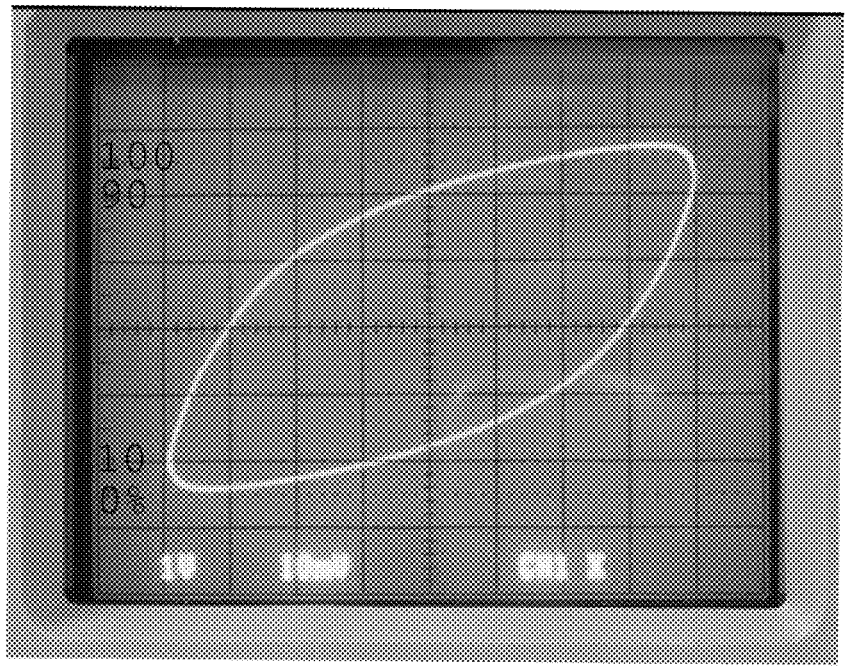
FIG. 6: a typical oscilloscope trace for the passive memory element of INVENTION EXAMPLE 7 with a PEDOT/PSS first electrode applied by inkjet printing, a ferroelectric layer applied by flexographic printing with solution B and a PEDOT/PSS second electrode applied by flexographic printing with the voltage over a capacitor of 1 µF as the y-axis and the swept voltage as the x-axis.

FIG. 6 shows a typical measurement of the passive memory element of INVENTION EXAMPLE 7 recorded at 50 Hz and 80 volts showing a potential of 40 mV corresponding to a remnant polarization of 4.0 µC/cm$^2$.

The passive memory elements of INVENTION EXAMPLES 6 and 7 exhibited remnant polarizations typical for ferroelectric polymers of the type of copolymer 1, see e.g. R. C. G. Naber et al. in Applied Physics Letters, volume 85, pages 2032-2034 (2004), and hence these passive memory elements are capable of performing as passive memory elements.

INVENTION EXAMPLE 8

Two Part Inkjet-Flexo-Screen-Printed Element

The passive memory element of INVENTION EXAMPLE 8 was produced by first printing a first PET-substrate with a PEDOT/PSS-electrode pattern having lines 25 mm in length and 1 mm in width using printing method 3. Solution A of ferroelectric copolymer 1 was then applied to the first electrode using printing method 4B and was annealed for 35 minutes at 140° C.

The second electrode pattern was then produced by printing a second subbed PET-substrate with a PEDOT/PSS-electrode pattern having lines 25 mm in length and 1 mm in width using printing method 1.

The final device was produced by bringing the printed ferroelectric polymer layer on the first substrate into intimate contact with the second electrode pattern by pressing together at room temperature.

The ferroelectric measurements were carried out as described for the passive memory element of INVENTION EXAMPLE 1. A typical oscilloscope trace recorded at 50 Hz and a swept voltage of 80V i.e. −40V to +40V showed a potential of 35 mV corresponding to a remnant polarization of 3.5 µC/cm$^2$, which is typical for ferroelectric polymers of the type of copolymer 1 and hence this passive memory element is capable of performing as a passive memory element.

INVENTION EXAMPLE 9

Two Part Flexo-Flexo-Inkjet Printed Element

The passive memory element of INVENTION EXAMPLE 9 was produced by first printing a first PET-substrate with a PEDOT/PSS-electrode pattern having lines 25 mm in length and 1 mm in width using printing method 2 (flexographic printing). Solution C of ferroelectric copolymer 1 was then applied to the first electrode using printing method 4C and was annealed for 35 minutes at 140° C.

The second electrode pattern was then produced by printing a second subbed PET-substrate with a PEDOT/PSS-electrode pattern having lines 25 mm in length and 1 mm in width using printing method 3 (inkjet).

The final device was produced by bringing the printed ferroelectric polymer layer on the first substrate into intimate contact with the second electrode pattern by pressing together at room temperature.

The ferroelectric measurements were carried out as described for the passive memory element of INVENTION EXAMPLE 1. A typical oscilloscope trace recorded at 20 Hz and a swept voltage of 70V i.e. −35V to +35V showed a potential of 100 mV corresponding to a remnant polarization of 10.0 µC/cm$^2$, which is typical for ferroelectric polymers of the type of copolymer 1 and hence this passive memory element is capable of performing as a passive memory element.

INVENTION EXAMPLE 10 AND 11

Two Part Flexo-Flexo-Printed Memory Elements with Alternative Second Electrodes

The passive memory element of INVENTION EXAMPLES 10 and 11 were produced by first printing a first PET-substrate with a PEDOT/PSS-electrode pattern having lines 25 mm in length and 1 mm in width using printing method 2 (flexographic printing). Solution A, Solution B and Solution C of ferroelectric copolymer 1 were then applied respectively in the number of layers given in table 7 below to the passive memory elements of INVENTION EXAMPLES 10 and 11, 12 and 13 respectively to the first electrode using printing methods 4A, 4B and 4C respectively for the passive memory elements and the layers were annealed for 35 minutes at 140° C.

Three different types of top electrodes were applied to a second subbed PET-substrate: A) ThermoKett 2000 (a water-based carbon flexographic ink from Akzo Nobel) using printing method 5 (flexographic printing); b) Luxprint 7145L (a screenprint silver paste from Dupont) using printing method 6 (screen printing. and c) PANIPOL° W using printing method 10 providing a line 1 mm in width.

The final devices were produced by bringing the printed ferroelectric polymer layer on the first substrate into intimate contact with the second electrode pattern on the respective "second" substrate by pressing together at room temperature producing the passive memory elements of INVENTION EXAMPLES 10 and 11 respectively.

The ferroelectric measurements were carried out as described for the passive memory element of INVENTION EXAMPLE 1. The remnant polarizations were calculated from the potential across the 1 µF capacitor and the swept voltage and frequency together with the potentials and the remnant polarizations calculated therefrom are summarized in Table 7 below.

TABLE 7

| EXAMPLE nr. | First electrode | Copolymer 1 | Second electrode | Swept voltage [V] | Frequency [Hz] | Potential over 1 µF capacitance [mV] | $P_R$ remanent polarization [µC/cm$^2$] |
| --- | --- | --- | --- | --- | --- | --- | --- |
| 10 | 2 | 2x 4A | 5 | 160 | 50 Hz | 20 | 1.0 |
| 11 | 2 | 2x 4A | 6 | 160 | 50 Hz | 50 | 2.5 |
| 12 | 2 | 4B | 10 | 120 | 50 Hz | 60 | 6.0 |
| 13 | 2 | 4C | 10 | 80 | 50 Hz | 13 | 1.3 |

Figure 7:
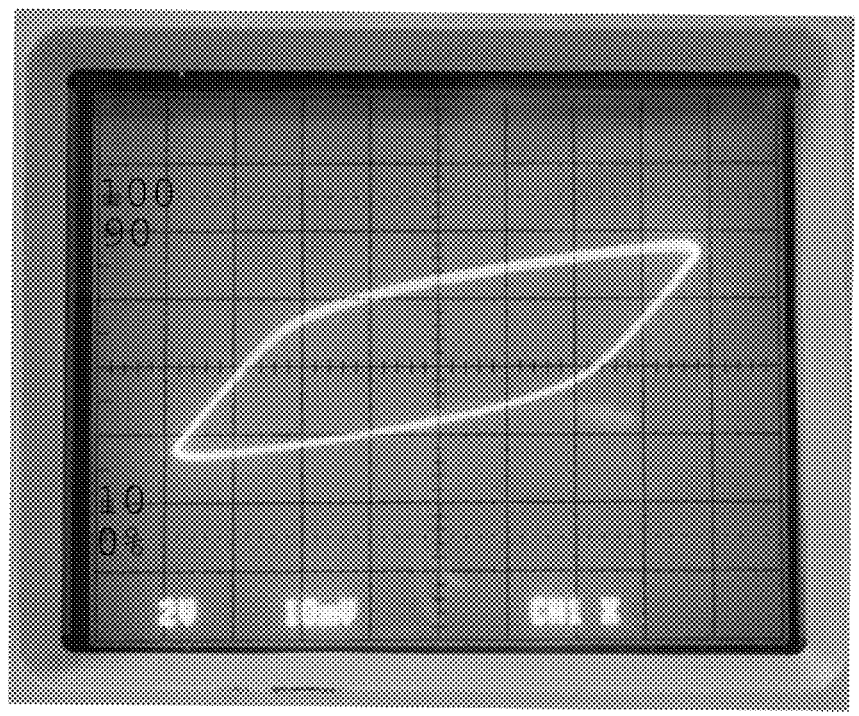
FIG. 7: a typical oscilloscope trace for the passive memory element of INVENTION EXAMPLE 10 with a PEDOT/PSS first electrode applied by flexographic printing, a ferroelectric layer applied by flexographic printing twice with solution A and a carbon second electrode also applied by flexographic printing with the voltage over a capacitor of 1 µF as the y-axis and the swept voltage as the x-axis.

FIG. 7 shows a typical oscilloscope trace for the passive memory elements of INVENTION EXAMPLE 10 recorded at 50 Hz and 160 volts showing a potential of 20 mV corresponding to a remnant polarization of 1.0 µC/cm$^2$.

The passive memory elements of INVENTION EXAMPLES 10 and 11 exhibited remnant polarizations typical for ferroelectric polymers of the type of copolymer 1, see e.g. R. C. G. Naber et al. in Applied Physics Letters, volume 85, pages 2032-2034 (2004), and hence these passive memory elements are capable of performing as passive memory elements.

INVENTION EXAMPLE 14 TO 16

Flexo-Flexo-Printed Memory Elements with Alternative Second Electrodes on a Single Substrate The passive memory element of INVENTION EXAMPLES 12 to 16 were produced by first printing a first PET-substrate with a PEDOT/PSS-electrode pattern having lines 25 mm in length and 1 mm in width using printing method 2 (flexographic printing). Solution B of ferroelectric copolymer 1 was then applied the number of times given in Table 8 below to the first electrode using printing method 4B and the layers were annealed for 35 minutes at 140° C.

Four different types of top electrodes were applied by hand to the ferroelectric layer: A) ThermoKett 2000 (a water-based carbon flexographic ink from Akzo Nobel) using printing method 7 providing a line 2 mm in width; b) Luxprint 7145L (a screenprint silver paste from Dupont) using printing method 8 providing a line 3 mm in width; c) a PEDOT/PSS dispersion containing ZONYL® FSO100 and glycidoxypropyltrimethoxysilane using printing method 9 providing a line 5 mm in width; The passive memory elements of INVENTION EXAMPLES 12 to 16 were thereby produced.

The ferroelectric measurements were carried out as described for the passive memory element of INVENTION EXAMPLE 1. The remnant polarizations were calculated from the potential across the 1 µF capacitor and the swept voltage and frequency together with the potentials and the remnant polarizations calculated therefrom are summarized in Table 8 below.

INVENTION EXAMPLE 17 AND 18

Screen-Flexo-Screen-Printed Memory Elements

The passive memory element of INVENTION EXAMPLE 17 was produced by first printing a first subbed PET-substrate with a PEDOT/PSS-electrode pattern having lines 25 mm in length and 1 mm in width using printing method 1 (screen printing). Solution A and B of ferroelectric copolymer 1 was then applied to the first electrode using printing method 4A and 4B respectively for the passive memory elements of INVENTION EXAMPLES 17 and 18 respectively and the layers were annealed for 35 minutes at 140° C.

The second electrode pattern was then produced on a second subbed PET-substrate as described for the first electrode.

The final devices were produced by bringing the printed ferroelectric polymer layer on the first substrate into intimate contact with the second electrode pattern by pressing together at room temperature.

The ferroelectric measurements were carried out as described for the passive memory element of INVENTION EXAMPLE 1. The remnant polarizations were calculated from the potential across the 1 µF capacitor and the swept voltage and frequency together with the potentials and the remnant polarizations calculated therefrom are summarized in Table 9 below.

TABLE 8

| EXAMPLE nr. | First electrode | Copolymer 1 | Second electrode | Swept voltage [V] | Frequency [Hz] | Potential over 1 µF capacitance [mV] | $P_R$ remanent polarization [µC/cm$^2$] |
| --- | --- | --- | --- | --- | --- | --- | --- |
| 14 | 2 | 3x 4B | 7 | 160 | 50 Hz | 180 | 9.0 |
| 15 | 2 | 4x 4B | 8 | 200 | 50 Hz | 60 | 2.0 |
| 16 | 2 | 3x 4B | 9 | 160 | 50 Hz | 300 | 6.0 |

The passive memory elements of INVENTION EXAMPLES 14 to 16 exhibited remnant polarizations typical

TABLE 9

| EXAMPLE nr. | First electrode | Copolymer 1 | Second electrode | Swept voltage [V] | Frequency [Hz] | Potential over 1 µF capacitance [mV] | $P_R$ remnant polarization [µC/cm$^2$] |
|---|---|---|---|---|---|---|---|
| 17 | 1 | 4A | 1 | 130 | 50 Hz | 60 | 6.0 |
| 18 | 1 | 4B | 1 | 80 | 50 Hz | 40 | 4.0 |

Figure 8:
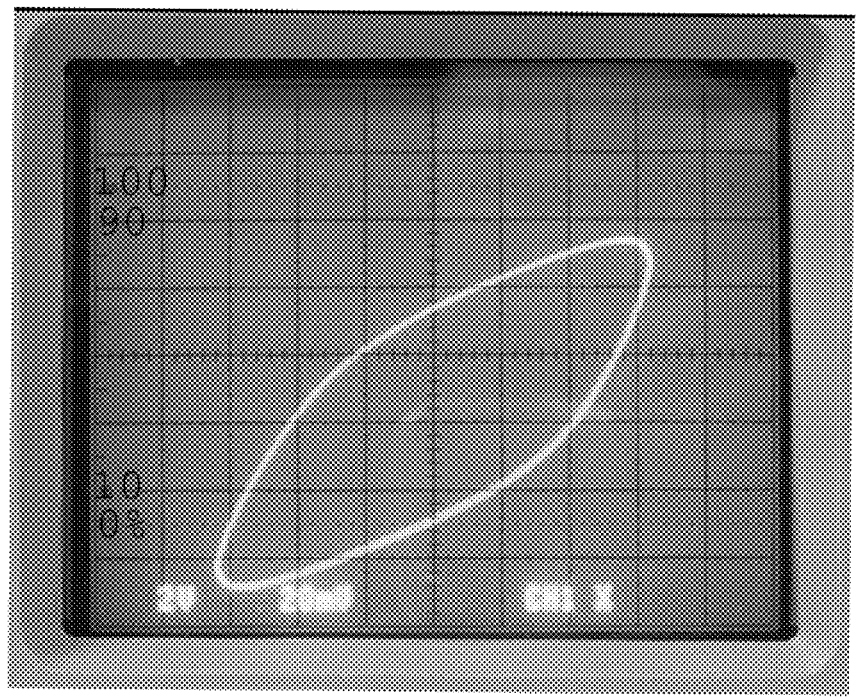
FIG. 8: a typical oscilloscope trace for the passive memory element of INVENTION EXAMPLE 17 with a PEDOT/PSS first electrode applied by screen printing, a ferroelectric layer applied by flexographic printing with solution A and a PEDOT/PSS second electrode applied by screen printing with the voltage over a capacitor of 1 µF as the y-axis and the swept voltage as the x-axis.

FIG. 8 shows a typical oscilloscope trace for the passive memory element of INVENTION EXAMPLE 17 recorded at 50 Hz and 130 volts showing a potential of 60 mV corresponding to a remnant polarization of 6.0 µC/cm$^2$.

The passive memory elements of INVENTION EXAMPLES 17 and 18 exhibited remnant polarizations typical for ferroelectric polymers of the type of copolymer 1, see e.g. R. C. G. Naber et al. in Applied Physics Letters, volume 85, pages 2032-2034 (2004), and hence these passive memory elements are capable of performing as passive memory elements.

INVENTION EXAMPLE 19 AND 20

Effect of Ferroelectric Layer Thickness in Two-Part Elements

The passive memory element of INVENTION EXAMPLES 19 and 20 were produced by first printing a first subbed PET-substrate with a PEDOT/PSS-electrode pattern having lines 25 mm in length and 1 mm in width using printing method 2 (flexographic printing). Two samples were prepared, in the case of the passive memory element of INVENTION EXAMPLE 19 the ferroelectric layer was flexo printed using solution C of ferroelectric copolymer 1 and in the case of the passive memory element of INVENTION EXAMPLE 20 two layers were printed on top of each other using solution B of ferroelectric copolymer 1. The ferroelectric layers of passive memory elements 19 and 20 were annealed for 35 minutes at 140° C.

The second PEDOT/PSS-electrode pattern was then produced on a second subbed PET-substrate by using printing method 1.

The final devices were produced by bringing the printed ferroelectric polymer layer on the first substrate into intimate contact with the second electrode pattern by pressing together at room temperature.

The ferroelectric measurements were carried out as described for the passive memory element of INVENTION EXAMPLE 1. The remnant polarizations were calculated from the potential across the 1 µF capacitor and the swept voltage and frequency together with the potentials and the remnant polarizations calculated therefrom are summarized in Table 10 below.

voltage used, hence opening the possibility of storing additional non-rewritable information in the memory device.

INVENTION EXAMPLES 15 AND 21

Effect of Ferroelectric Layer Thickness in Two Part Elements

The passive memory element of INVENTION EXAMPLES 15 and 21 were produced by first printing a first subbed PET-substrate with a PEDOT/PSS-electrode pattern having lines 25 mm in length and 1 mm in width using printing method 2 (flexographic printing). Two samples were prepared, in the case of the passive memory element of INVENTION EXAMPLE 15 the ferroelectric layer was flexo printed using solution B of ferroelectric copolymer 1 and in the case of the passive memory element of INVENTION EXAMPLE 21 two layers were printed on top of each other using solution B of ferroelectric copolymer 1. The ferroelectric layers of passive memory elements 19 and 20 were annealed for 35 minutes at 140° C.

The second PEDOT/PSS-electrode pattern was then produced by applying an electrode pattern of PANI by hand to a second subbed PET-substrate.

The final devices were produced by bringing the printed ferroelectric polymer layer on the first substrate into intimate contact with the second electrode pattern on the second substrate by pressing together at room temperature.

The ferroelectric measurements were carried out as described for the passive memory element of INVENTION EXAMPLE 1. The remnant polarizations were calculated from the potential across the 1 µF capacitor and the swept voltage and frequency together with the potentials and the remnant polarizations calculated therefrom are summarized in Table 11 below.

TABLE 10

| EXAMPLE nr. | First electrode | Copolymer 1 | Second electrode | Swept voltage [V] | Frequency [Hz] | Potential over 1 µF capacitance [mV] | $P_R$ remnant polarization [µC/cm$^2$] |
|---|---|---|---|---|---|---|---|
| 19 | 2 | 4C | 1 | 70 | 50 | 70 | 7.0 |
| 20 | 2 | 2x 4B | 1 | 80 | 50 | 2 | 0.2 |

By increasing the thickness of the ferroelectric layer, memory cells can be made significantly less active at the readout

TABLE 11

| EXAMPLE nr. | First electrode | Copolymer 1 | Second electrode | Swept voltage [V] | Frequency [Hz] | Potential over 1 μF capacitance [mV] | $P_R$ remanent polarization [μC/cm$^2$] |
| --- | --- | --- | --- | --- | --- | --- | --- |
| 15 | 2 | 4B | 10 | 160 | 50 | 60 | 6.0 |
| 21 | 2 | 2x 4B | 10 | 160 | 50 | 15 | 1.5 |

By increasing the thickness of the ferroelectric layer, memory cells can be made significantly less active at the readout voltage used, hence opening the possibility of storing additional non-rewritable information in the memory device.

INVENTION EXAMPLES 22 TO 24

Dependence of Remnant Polarization Upon Swept Voltage in Two Part Memory Elements The passive memory element of INVENTION EXAMPLES 22 to 24 were produced by first printing a first PET-substrate with a PEDOT/PSS-electrode pattern having lines 25 mm in length and 1 mm in width using printing method 2 (flexographic printing). Solution C of ferroelectric copolymer 1 was then applied to the first electrode using printing method 4C and the layers were annealed for 35 minutes at 140° C.

The second electrode pattern was then produced by printing a second subbed PET-substrate with a PEDOT/PSS-electrode pattern having lines 25 mm in length and 1 mm in width using printing method 1 (screen printing).

The final devices were produced by bringing the printed ferroelectric polymer layer on the first substrate into intimate contact with the second electrode pattern by pressing together at room temperature.

The ferroelectric measurements were carried out on the passive memory elements of INVENTION EXAMPLES 22 to 24 as described for the passive memory element of INVENTION EXAMPLE 1. The remnant polarizations were calculated from the potential across the 1 μF capacitor and the swept voltage and frequency together with the potentials and the remnant polarizations calculated therefrom are summarized in Table 12 below.

TABLE 12

| EXAMPLE nr. | First electrode | Copolymer 1 | Second electrode | Swept voltage [V] | Frequency [Hz] | Potential over 1 μF capacitance [mV] | $P_R$ remanent polarization [μC/cm$^2$] |
| --- | --- | --- | --- | --- | --- | --- | --- |
| 22 | 2 | 4C | 1 | 80 | 50 Hz | 8 | 0.8 |
| 23 | 2 | 4C | 1 | 120 | 50 Hz | 17 | 1.7 |
| 24 | 2 | 4C | 1 | 160 | 50 Hz | 25 | 2.5 |

The remnant polarization of these devices increased significantly with increasing swept voltage.

INVENTION EXAMPLES 25 TO 29

Dependence of Remnant Polarization Upon Swept Voltage in Two Part Memory Elements The passive memory element of INVENTION EXAMPLES 25 to 29 were produced by first printing a first PET-substrate with a PEDOT/PSS-electrode pattern having lines 25 mm in length and 1 mm in width using printing method 2 (flexographic printing). Solution B of ferroelectric copolymer 1 was then applied to the first electrode using printing method 4B and the layer was annealed for 35 minutes at 140° C. (shorter times may well be possible).

The second electrode pattern was then produced by printing a second subbed PET-substrate with a PEDOT/PSS-electrode pattern having lines 25 mm in length and 1 mm in width using printing method 2 (flexographic printing).

The final devices were produced by bringing the printed ferroelectric polymer layer on the first substrate into intimate contact with the second electrode pattern by pressing together at room temperature.

The ferroelectric measurements were carried out on the passive memory elements of INVENTION EXAMPLES 25 to 29 as described for the passive memory element of INVENTION EXAMPLE 1. The remnant polarizations were calculated from the potential across the 1 μF capacitor and the swept voltage and frequency together with the potentials and the remnant polarizations calculated therefrom are summarized in Table 13 below.

TABLE 13

| EXAMPLE nr. | First electrode | Copolymer 1 | Second electrode | Swept voltage [V] | Frequency [Hz] | Potential over 1 µF capacitance [mV] | $P_R$ remanent polarization [µC/cm$^2$] |
|---|---|---|---|---|---|---|---|
| 25 | 2 | 4B | 2 | 40 | 50 | 4 | 0.4 |
| 26 | 2 | 4B | 2 | 60 | 50 | 12 | 1.2 |
| 27 | 2 | 4B | 2 | 80 | 50 | 23 | 2.3 |
| 28 | 2 | 4B | 2 | 100 | 50 | 43 | 4.3 |
| 29 | 2 | 4B | 2 | 120 | 50 | 55 | 5.5 |

Figure 9:
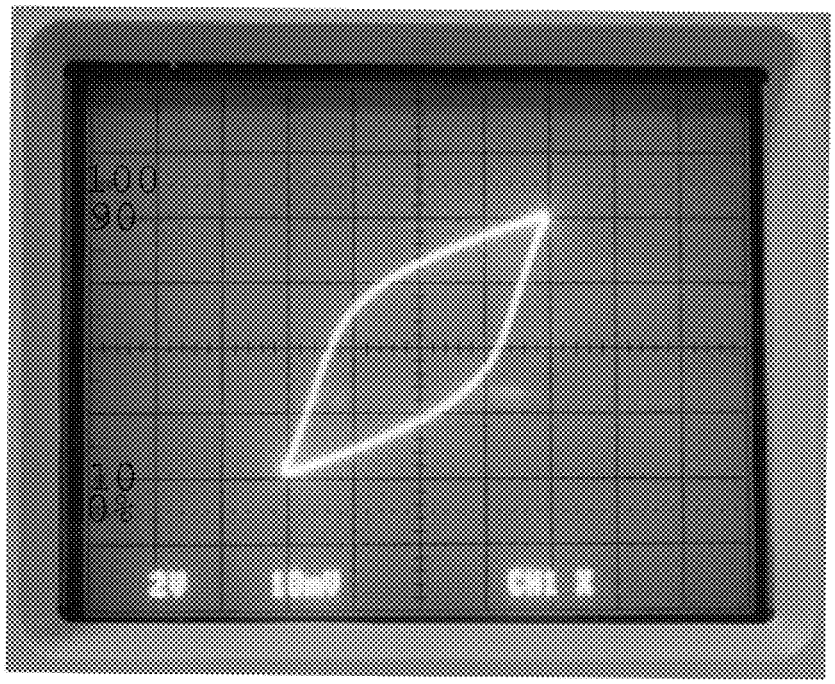
FIG. 9: a typical oscilloscope trace for the passive memory element of INVENTION EXAMPLE 27 with a PEDOT/PSS first electrode applied by flexographic printing, a ferroelectric layer applied by flexographic printing with solution B and a PEDOT/PSS second electrode also applied by flexographic printing with the voltage over a capacitor of 1 µF as the y-axis and the swept voltage as the x-axis.

FIG. 9 shows a typical oscilloscope trace for the passive memory element of INVENTION EXAMPLE 27 recorded at 50 Hz and 80 volts showing a potential of 23 mV corresponding to a remnant polarization of 2.3 µC/cm$^2$.

The remnant polarization of these devices increased significantly with increasing swept voltage.

INVENTION EXAMPLE 30

DSCN 3518

The passive memory element of INVENTION EXAMPLE 30 was produced by first printing a first PET-substrate with a PEDOT/PSS-electrode pattern having lines 25 mm in length and 1 mm in width using printing method 1 (screen printing). Instead of a ferroelectric layer, an insulating material (Noripet 093 Clear from Proll) was applied on the first electrode pattern by screen printing through a mesh 62 screen, and dried at 130° C. for 3 minutes.

The second electrode pattern was then produced by printing a second subbed PET-substrate with a PEDOT/PSS-electrode pattern having lines 25 mm in length and 1 mm in width using printing method 1 (screen printing].

The final device was produced by bringing the printed insulating layer on the first substrate into intimate contact with the second electrode pattern by pressing together at room temperature.

Figure 10:
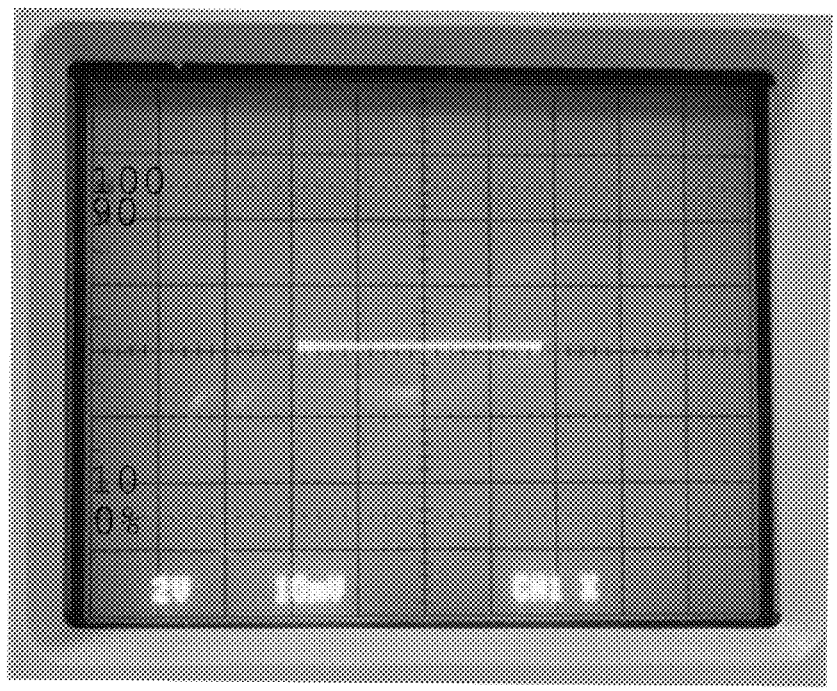
FIG. 10: a typical oscilloscope trace for the passive memory element of INVENTION EXAMPLE 30 with a PEDOT/PSS first electrode applied by screen printing, an insulating layer applied by screen printing and a PEDOT/PSS second electrode also applied by screen printing with the voltage over a capacitor of 1 µF as the y-axis and the swept voltage as the x-axis.

The ferroelectric measurements were carried out as described for the passive memory element of INVENTION EXAMPLE 1. FIG. 10 shows a typical oscilloscope trace, recorded at 50 Hz and a swept voltage of 70V i.e. −35V to +35V showing no hysteresis loop. By using an insulating material instead of the ferroelectric polymer, memory cells can be made inactive at the used readout voltage, hence storing additional non-rewritable information in the memory device.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

Having described in detail preferred embodiments of the current invention, it will now be apparent to those skilled in the art that numerous modifications can be made therein without departing from the scope of the invention as defined in the following claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

We claim:

1. A process for providing a passive memory device comprising at least one passive ferroelectric memory element and at least one substrate, at least one of said at least one substrate having at least one conductive surface or surface layer on at least one side of said at least one substrate which is provided with said passive ferroelectric memory element, said passive ferroelectric memory element comprising a first electrode system and a second electrode system, and an overprinted image or a homogeneously coloured or opaque layer on said first and second electrode systems so as to visually hide said first and second electrode systems, wherein said first electrode system is at least partly insulated from said second electrode system by an element system comprising at least one ferroelectric element, wherein said first electrode system is a conductive surface, or a conductive layer, wherein said second electrode system is an electrode pattern or a plurality of isolated conductive areas in contact with, for read-out and/or data-input purposes only, a plurality of conducting pins isolated from one another, and wherein, with the exception of said first electrode system being the conductive surface of a metallic substrate, said systems being printable by conventional printing processes, the process comprising the steps of: providing said at least one substrate, realizing said conductive layer on said substrate if the substrate is non-metallic; realizing an element system comprising at least one ferroelectric element on said conductive surface or conductive layer, providing an electrode pattern or a plurality of isolated conducting areas on said element system, and overprinting said first and second electrode systems with an image or providing a homogeneously colored or opaque layer thereon, wherein at least one of the steps of providing a conductive layer if the substrate is non-conductive, providing an element system and providing a plurality of isolated conducting areas is realized with a conventional printing process.

2. The process for providing a passive memory device according to claim 1, wherein all of the steps of optionally providing a conductive layer, providing an element system and providing a plurality of isolated conducting areas are realized with conventional printing processes.

3. The process for providing a passive memory device according to claim 2, wherein said at least one conventional printing process is an impact printing process.

4. The process for providing a passive memory device according to claim 2, wherein said element system further comprises voids resulting in contact between said first and said second electrode systems.

5. The process for providing a passive memory device according to claim 1, wherein said at least one conventional printing process is a non-impact printing process.

6. The process for providing a passive memory device according to claim 5, wherein said element system further comprises voids resulting in contact between said first and said second electrode systems.

7. The process for providing a passive memory device according to claim 1, wherein said at least one conventional printing process is an impact printing process.

8. The process for providing a passive memory device according to claim 7, wherein said element system further comprises voids resulting in contact between said first and said second electrode systems.

9. The process for providing a passive memory device according to claim 1, wherein said conventional printing process is selected from the group consisting of ink-jet printing, intaglio printing, screen printing, flexographic printing, offset printing, stamp printing, gravure printing, electrophotographic printing, electrographic printing and thermal and laser-induced processes.

10. The process for providing a passive memory device according to claim 9, wherein said element system further comprises voids resulting in contact between said first and said second electrode systems.

11. The process for providing a passive memory device according to claim 1, wherein said element system further comprises voids resulting in contact between said first and said second electrode systems.

12. The process for providing a passive memory device according to claim 1, wherein said element system further comprises insulating elements not having ferroelectric properties under read-out or data-input conditions.

13. A process for providing a passive memory device, said passive memory device comprising a substrate and a passive memory element on at least one side of said at least one substrate, said passive memory element comprising a first patterned electrode system, a second patterned electrode system, an element system comprising at least one ferroelectric element between said first patterned electrode system and said second patterned electrode system, and a coloured or opaque foil laminated over said first and second patterned electrode systems so as to visually hide the location of said first and second patterned electrode systems, the process comprising the steps of: realizing a first electrode pattern on a non-conductive surface of a substrate, providing said element system on said first electrode pattern, providing a second electrode pattern on said element system, and laminating a coloured or opaque foil over said first and second patterned electrode systems, wherein the steps of providing a first patterned electrode system, providing an organic ferroelectric layer and providing a second electrode system are all realized with a conventional printing process.

14. The process for providing a passive memory device according to claim 13, wherein said provision of said first patterned electrode system comprises patterning a pre-coated conductive layer in a one pass printing step.

15. The process for providing a passive memory device according to claim 14, wherein said pre-coated conductive layer comprises an intrinsically conductive polymer.

16. The process for providing a passive memory device according to claim 15, wherein said intrinsically conductive polymer is a substituted or unsubstituted polythiophene, a substituted or unsubstituted polyaniline or a substituted or unsubstituted polypyrrole.

17. The process for providing a passive memory element according to claim 16, wherein said substituted or unsubstituted polythiophene is represented by formula (I):

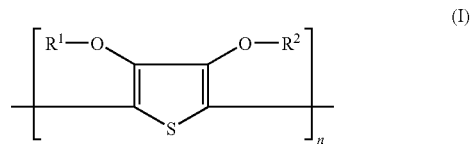

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

18. The process for providing a passive memory element according to claim 13, wherein said passive memory element consists of organic materials.

19. The process for providing a passive memory element according to claim 13, wherein said conventional printing process is a non-impact printing process.

20. The process for providing a passive memory element according to claim 13, wherein said conventional printing process is an impact printing process.

21. The process for providing a passive memory element according to claim 13, wherein said conventional printing process is selected from the group consisting of ink-jet printing, intaglio printing, screen printing, flexographic printing, offset printing, stamp printing, gravure printing, electrophotographic printing, electrographic printing and thermal and laser-induced processes.

22. The process for providing a passive memory element according to claim 13, wherein said element system further comprises voids resulting in contact between said first and said second electrode systems.

23. The process for providing a passive memory element according to claim 13, wherein said element system further comprises insulating elements not having ferroelectric properties under read-out or data-input conditions.

* * * * *